United States Patent
Shinriki et al.

(10) Patent No.: US 8,084,104 B2
(45) Date of Patent: Dec. 27, 2011

(54) ATOMIC COMPOSITION CONTROLLED RUTHENIUM ALLOY FILM FORMED BY PLASMA-ENHANCED ATOMIC LAYER DEPOSITION

(75) Inventors: Hiroshi Shinriki, Matsudo (JP); Kunitoshi Namba, Machida (JP); Daekyun Jeong, Tama (JP)

(73) Assignee: ASM Japan K.K., Tokyo (JP)

( * ) Notice: Subject to any disclaimer, the term of this patent is extended or adjusted under 35 U.S.C. 154(b) by 601 days.

(21) Appl. No.: 12/201,434

(22) Filed: Aug. 29, 2008

(65) Prior Publication Data
US 2010/0055433 A1  Mar. 4, 2010

(51) Int. Cl.
*C23C 16/00* (2006.01)

(52) U.S. Cl. ........................................ 427/569; 428/698

(58) Field of Classification Search .................. None
See application file for complete search history.

(56) References Cited

U.S. PATENT DOCUMENTS

| | | | |
|---|---|---|---|
| 4,058,430 A | 11/1977 | Suntola et al. |
| 4,210,608 A | 7/1980 | Pinke |
| 4,477,296 A | 10/1984 | Nair |
| 4,604,118 A | 8/1986 | Bocko et al. |
| 4,670,110 A | 6/1987 | Withers et al. |
| 4,860,687 A | 8/1989 | Frijlink |
| 4,891,050 A | 1/1990 | Bowers et al. |
| 4,902,551 A | 2/1990 | Nakaso et al. |
| 4,965,656 A | 10/1990 | Koubuchi et al. |
| 5,106,454 A | 4/1992 | Allardyce et al. |
| 5,382,333 A | 1/1995 | Ando et al. |
| 5,391,517 A | 2/1995 | Gelatos et al. |
| 5,453,494 A | 9/1995 | Kirlin et al. |
| 5,637,533 A | 6/1997 | Choi |
| 5,695,810 A | 12/1997 | Dubin et al. |
| 5,711,811 A | 1/1998 | Suntola et al. |
| 5,731,634 A | 3/1998 | Matsuo et al. |
| 5,820,664 A | 10/1998 | Gardiner et al. |
| 5,865,365 A | 2/1999 | Nishikawa et al. |

(Continued)

FOREIGN PATENT DOCUMENTS

DE    41 08 73    3/1925

(Continued)

OTHER PUBLICATIONS

Hoyas et al., Growth and characterization of atomic layer deposited WC0.7N0.3 on polymer films, Journal of Applied Physics, Jan. 1, 2004, vol. 95, Issue 1, pp. 381-388.

(Continued)

*Primary Examiner* — Timothy Meeks
*Assistant Examiner* — Joseph Miller, Jr.
(74) *Attorney, Agent, or Firm* — Knobbe Martens Olson & Bear LLP

(57) ABSTRACT

A metal film composed of multiple atomic layers continuously formed by atomic layer deposition of Ru and Ta or Ti includes at least a top section and a bottom section, wherein an atomic composition of Ru, Ta or Ti, and N varies in a thickness direction of the metal film. The atomic composition of Ru, Ta or Ti, and N in the top section is represented as $Ru_{(x1)}Ta/Ti_{(y1)}N_{(z1)}$ wherein an atomic ratio of $Ru_{(x1)}/(Ta/Ti_{(y1)})$ is no less than 15, and z1 is 0.05 or less. The atomic composition of Ru, Ta or Ti, and N in the bottom section is represented as $Ru_{(x2)}Ta/Ti_{(y2)}N_{(z2)}$ wherein an atomic ratio of $Ru_{(x2)}/(Ta/Ti_{(y2)})$ is more than zero but less than 15, and z2 is 0.10 or greater.

15 Claims, 10 Drawing Sheets

U.S. PATENT DOCUMENTS

| | | | |
|---|---|---|---|
| 5,874,600 A | 2/1999 | Rautenstrauch et al. |
| 5,884,009 A | 3/1999 | Okase |
| 5,916,365 A | 6/1999 | Sherman et al. |
| 5,923,056 A | 7/1999 | Lee et al. |
| 5,939,334 A | 8/1999 | Nguyen et al. |
| 5,989,672 A | 11/1999 | Hayashi |
| 5,998,048 A | 12/1999 | Jin et al. |
| 6,006,763 A | 12/1999 | Mori et al. |
| 6,015,986 A | 1/2000 | Schuegraf |
| 6,033,584 A | 3/2000 | Ngo et al. |
| 6,040,243 A | 3/2000 | Li et al. |
| 6,063,705 A | 5/2000 | Vaartstra |
| 6,066,892 A | 5/2000 | Ding et al. |
| 6,074,945 A | 6/2000 | Vaartstra et al. |
| 6,108,937 A | 8/2000 | Raaijmakers |
| 6,124,189 A | 9/2000 | Watanabe et al. |
| 6,130,123 A | 10/2000 | Liang et al. |
| 6,133,159 A | 10/2000 | Vaartstra et al. |
| 6,136,163 A | 10/2000 | Cheung et al. |
| 6,139,700 A | 10/2000 | Kang et al. |
| 6,143,658 A | 11/2000 | Donnelly et al. |
| 6,144,060 A | 11/2000 | Park et al. |
| 6,171,910 B1 | 1/2001 | Hobbs et al. |
| 6,203,613 B1 | 3/2001 | Gates et al. |
| 6,268,291 B1 | 7/2001 | Andricacos et al. |
| 6,270,572 B1 | 8/2001 | Kim et al. |
| 6,281,125 B1 | 8/2001 | Vaartstra et al. |
| 6,294,467 B1 | 9/2001 | Yokoyama et al. |
| 6,297,539 B1 | 10/2001 | Ma et al. |
| 6,303,500 B1 | 10/2001 | Jiang et al. |
| 6,305,314 B1 | 10/2001 | Sneh et al. |
| 6,306,756 B1 | 10/2001 | Hasunuma et al. |
| 6,320,213 B1 | 11/2001 | Kirlin et al. |
| 6,323,131 B1 | 11/2001 | Obeng et al. |
| 6,335,280 B1 | 1/2002 | Van der Jeugd |
| 6,342,277 B1 | 1/2002 | Sherman et al. |
| 6,346,151 B1 | 2/2002 | Jiang et al. |
| 6,359,159 B1 | 3/2002 | Welch et al. |
| 6,380,080 B2 | 4/2002 | Visokay |
| 6,391,785 B1 | 5/2002 | Satta et al. |
| 6,395,650 B1 | 5/2002 | Callegari et al. |
| 6,403,414 B2 | 6/2002 | Marsh |
| 6,404,191 B2 | 6/2002 | Daughton et al. |
| 6,420,189 B1 | 7/2002 | Lopatin |
| 6,433,432 B2 | 8/2002 | Shimizu |
| 6,444,568 B1 | 9/2002 | Sundararajan et al. |
| 6,444,868 B1 | 9/2002 | Vaughn et al. |
| 6,455,424 B1 | 9/2002 | McTeer et al. |
| 6,464,779 B1 | 10/2002 | Powell et al. |
| 6,475,276 B1 | 11/2002 | Elers et al. |
| 6,478,931 B1 | 11/2002 | Wadley et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,534,395 B2 | 3/2003 | Werkhoven et al. |
| 6,541,067 B1 | 4/2003 | Marsh et al. |
| 6,551,399 B1 | 4/2003 | Shen et al. |
| 6,576,053 B1 | 6/2003 | Kim et al. |
| 6,586,330 B1 | 7/2003 | Ludviksson et al. |
| 6,593,656 B2 | 7/2003 | Ahn et al. |
| 6,617,173 B1 | 9/2003 | Shen |
| 6,649,091 B2 | 11/2003 | Ryan et al. |
| 6,656,748 B2 | 12/2003 | Hall et al. |
| 6,664,192 B2 | 12/2003 | Satta et al. |
| 6,679,951 B2 | 1/2004 | Soininen et al. |
| 6,680,540 B2 | 1/2004 | Nakano et al. |
| 6,703,708 B2 | 3/2004 | Werkhoven et al. |
| 6,713,381 B2 | 3/2004 | Barr et al. |
| 6,720,262 B2 | 4/2004 | Koh et al. |
| 6,759,325 B2 | 7/2004 | Raaijmakers et al. |
| 6,777,331 B2 | 8/2004 | Nguyen |
| 6,784,101 B1 | 8/2004 | Yu et al. |
| 6,784,504 B2 | 8/2004 | Derderian et al. |
| 6,800,542 B2 | 10/2004 | Kim |
| 6,800,567 B2 | 10/2004 | Cho et al. |
| 6,824,816 B2 | 11/2004 | Aaltonen et al. |
| 6,842,740 B1 | 1/2005 | Jeran et al. |
| 6,849,122 B1 | 2/2005 | Fair |
| 6,852,635 B2 | 2/2005 | Satta et al. |
| 6,878,628 B2 | 4/2005 | Sophie et al. |
| 6,881,260 B2 | 4/2005 | Marsh et al. |
| 6,881,437 B2 | 4/2005 | Ivanov et al. |
| 6,887,795 B2 | 5/2005 | Soininen et al. |
| 6,921,712 B2 | 7/2005 | Soininen et al. |
| 6,933,225 B2 | 8/2005 | Werkhoven et al. |
| 6,936,535 B2 | 8/2005 | Kim et al. |
| 6,955,986 B2 | 10/2005 | Li |
| 6,984,591 B1 | 1/2006 | Buchanan et al. |
| 7,011,981 B2 | 3/2006 | Kim et al. |
| 7,067,407 B2 | 6/2006 | Kostamo et al. |
| 7,105,054 B2 | 9/2006 | Lindfors |
| 7,107,998 B2 | 9/2006 | Greet et al. |
| 7,118,779 B2 | 10/2006 | Verghese et al. |
| 7,135,207 B2 | 11/2006 | Min et al. |
| 7,183,604 B2 | 2/2007 | Cartier et al. |
| 7,211,509 B1 | 5/2007 | Gopinath et al. |
| 7,220,451 B2 | 5/2007 | Bates et al. |
| 7,220,669 B2 | 5/2007 | Hujanen et al. |
| 7,241,677 B2 | 7/2007 | Soinenen et al. |
| 7,256,144 B2 | 8/2007 | Koyanagi et al. |
| 7,273,526 B2 | 9/2007 | Shinriki et al. |
| 7,273,814 B2 | 9/2007 | Tsukasa |
| 7,300,873 B2 | 11/2007 | Millward |
| 7,404,985 B2 | 7/2008 | Chang et al. |
| 7,419,903 B2 | 9/2008 | Haukka et al. |
| 7,435,484 B2 | 10/2008 | Shinriki et al. |
| 7,438,949 B2 | 10/2008 | Weidman |
| 7,476,618 B2 | 1/2009 | Kilpela et al. |
| 7,494,927 B2 | 2/2009 | Kostamo et al. |
| 7,541,284 B2 | 6/2009 | Park |
| 7,601,223 B2 | 10/2009 | Lindfors et al. |
| 7,615,480 B2 | 11/2009 | Boyd et al. |
| 7,655,564 B2 | 2/2010 | Shinriki |
| 7,666,773 B2 | 2/2010 | Huotari et al. |
| 7,785,658 B2 | 8/2010 | Shinriki et al. |
| 2001/0003064 A1 | 6/2001 | Ohto |
| 2001/0013617 A1 | 8/2001 | Toyoda et al. |
| 2001/0018266 A1 | 8/2001 | Jiang et al. |
| 2001/0030366 A1 | 10/2001 | Nakano et al. |
| 2001/0041250 A1 | 11/2001 | Werkhoven et al. |
| 2001/0052318 A1 | 12/2001 | Jiang et al. |
| 2002/0004293 A1 | 1/2002 | Soininen et al. |
| 2002/0006711 A1 | 1/2002 | Yamazaki et al. |
| 2002/0013487 A1 | 1/2002 | Norman et al. |
| 2002/0027286 A1 | 3/2002 | Sundararajan et al. |
| 2002/0064948 A1 | 5/2002 | Saito et al. |
| 2002/0102838 A1* | 8/2002 | Paranjpe et al. ............ 438/622 |
| 2002/0146513 A1 | 10/2002 | Jin et al. |
| 2002/0173054 A1 | 11/2002 | Kim |
| 2003/0013302 A1 | 1/2003 | Nguyen et al. |
| 2003/0059535 A1 | 3/2003 | Luo et al. |
| 2003/0080363 A1 | 5/2003 | Maruyama et al. |
| 2003/0088116 A1* | 5/2003 | Kawano et al. ............ 556/136 |
| 2003/0100162 A1 | 5/2003 | Joo |
| 2003/0121608 A1 | 7/2003 | Chen et al. |
| 2003/0135061 A1 | 7/2003 | Norman et al. |
| 2003/0165615 A1 | 9/2003 | Aaltonen et al. |
| 2003/0214043 A1 | 11/2003 | Saitoh et al. |
| 2003/0219991 A1 | 11/2003 | Geusic et al. |
| 2003/0233976 A1 | 12/2003 | Marsh et al. |
| 2004/0005753 A1 | 1/2004 | Kostamo et al. |
| 2004/0028952 A1 | 2/2004 | Cartier et al. |
| 2004/0038529 A1 | 2/2004 | Soininen et al. |
| 2004/0041194 A1 | 3/2004 | Marsh |
| 2004/0053496 A1 | 3/2004 | Choi |
| 2004/0082125 A1 | 4/2004 | Hou et al. |
| 2004/0087143 A1 | 5/2004 | Norman et al. |
| 2004/0095792 A1 | 5/2004 | Hermann et al. |
| 2004/0105934 A1 | 6/2004 | Chang et al. |
| 2004/0118697 A1 | 6/2004 | Wen et al. |
| 2004/0126944 A1 | 7/2004 | Rotondaro et al. |
| 2004/0142558 A1 | 7/2004 | Granneman |
| 2004/0152255 A1 | 8/2004 | Seidl et al. |
| 2004/0192021 A1 | 9/2004 | Li |
| 2004/0192036 A1 | 9/2004 | Koyanagi et al. |
| 2004/0214354 A1 | 10/2004 | Marsh et al. |
| 2004/0216668 A1 | 11/2004 | Lindfors et al. |

| | | | | | | |
|---|---|---|---|---|---|---|
| 2004/0224475 | A1 | 11/2004 | Lee et al. | KR | 10-2001-12889 | 12/2001 |
| 2005/0009325 | A1 | 1/2005 | Chung et al. | KR | 10-2003-0011399 | 2/2003 |
| 2005/0020060 | A1 | 1/2005 | Aaltonen et al. | KR | 1020050103373 | 10/2005 |
| 2005/0048794 | A1 | 3/2005 | Brask et al. | WO | WO 93/10652 | 5/1993 |
| 2005/0064207 | A1 | 3/2005 | Senzaki et al. | WO | WO 98/01890 | 1/1998 |
| 2005/0082587 | A1 | 4/2005 | Marsh | WO | WO 99/17343 | 4/1999 |
| 2005/0085031 | A1 | 4/2005 | Lopatin et al. | WO | WO 00/03420 | 1/2000 |
| 2005/0087879 | A1 | 4/2005 | Won et al. | WO | WO 00/38191 | 6/2000 |
| 2005/0089632 | A1 | 4/2005 | Vehkamaki et al. | WO | WO 01/88972 | 5/2001 |
| 2005/0092247 | A1 | 5/2005 | Schmidt et al. | WO | WO 01/50502 | 7/2001 |
| 2005/0095781 | A1 | 5/2005 | Papa Rao et al. | WO | WO 02/09126 | 1/2002 |
| 2005/0098440 | A1 | 5/2005 | Kailasan et al. | WO | WO 02/09158 | 1/2002 |
| 2005/0118807 | A1 | 6/2005 | Kim et al. | WO | WO 03/023835 | 3/2003 |
| 2005/0124154 | A1 | 6/2005 | Park et al. | WO | WO03/040150 | 5/2003 |
| 2005/0181555 | A1 | 8/2005 | Haukka et al. | WO | WO 03/056612 A1 | 7/2003 |
| 2005/0208754 | A1 | 9/2005 | Kostamo et al. | WO | WO2004/035858 | 4/2004 |
| 2005/0229848 | A1 | 10/2005 | Shinriki et al. | WO | WO 2004/035858 | 4/2004 |
| 2005/0238808 | A1 | 10/2005 | Gatineau et al. | WO | WO 2006/035281 | 4/2006 |
| 2005/0266700 | A1 | 12/2005 | Jursich et al. | WO | WO 2009/146870 | 12/2009 |
| 2005/0271812 | A1 | 12/2005 | Myo et al. | | | |
| 2006/0013955 | A1 | 1/2006 | Senzaki | | | |
| 2006/0019495 | A1* | 1/2006 | Marcadal et al. ............ 438/683 | | | |
| 2006/0035462 | A1 | 2/2006 | Millward | | | |
| 2006/0063375 | A1* | 3/2006 | Sun et al. .................... 438/629 | | | |
| 2006/0073276 | A1 | 4/2006 | Antonissen | | | |
| 2006/0093848 | A1 | 5/2006 | Senkevich et al. | | | |
| 2006/0118968 | A1* | 6/2006 | Johnston et al. ............ 257/775 | | | |
| 2006/0121733 | A1 | 6/2006 | Kilpela et al. | | | |
| 2006/0128150 | A1 | 6/2006 | Gandikota et al. | | | |
| 2006/0137608 | A1 | 6/2006 | Choi et al. | | | |
| 2006/0165892 | A1 | 7/2006 | Weidman | | | |
| 2006/0177601 | A1 | 8/2006 | Park et al. | | | |
| 2006/0211228 | A1 | 9/2006 | Matsuda | | | |
| 2006/0216932 | A1 | 9/2006 | Kumar et al. | | | |
| 2006/0223300 | A1 | 10/2006 | Simka et al. | | | |
| 2006/0263977 | A1 | 11/2006 | Kim et al. | | | |
| 2007/0014919 | A1 | 1/2007 | Hamalainen et al. | | | |
| 2007/0026654 | A1 | 2/2007 | Huotari et al. | | | |
| 2007/0036892 | A1 | 2/2007 | Haukka et al. | | | |
| 2007/0059502 | A1 | 3/2007 | Wang et al. | | | |
| 2007/0082132 | A1* | 4/2007 | Shinriki et al. ........ 427/255.394 | | | |
| 2007/0190782 | A1 | 8/2007 | Park | | | |
| 2008/0038465 | A1 | 2/2008 | Dussurrat | | | |
| 2008/0054472 | A1 | 3/2008 | Shinriki et al. | | | |
| 2008/0124484 | A1 | 5/2008 | Shinriki et al. | | | |
| 2008/0146042 | A1 | 6/2008 | Kostamo et al. | | | |
| 2008/0171436 | A1 | 7/2008 | Koh et al. | | | |
| 2008/0200019 | A9 | 8/2008 | Huotari et al. | | | |
| 2008/0206982 | A1 | 8/2008 | Suzuki | | | |
| 2008/0206985 | A1 | 8/2008 | Kim et al. | | | |
| 2008/0214003 | A1 | 9/2008 | Xia | | | |
| 2008/0296768 | A1 | 12/2008 | Chebiam | | | |
| 2008/0315418 | A1 | 12/2008 | Boyd | | | |
| 2008/0318417 | A1 | 12/2008 | Shinriki et al. | | | |
| 2009/0068832 | A1 | 3/2009 | Haukka et al. | | | |
| 2009/0087339 | A1 | 4/2009 | Shinriki | | | |
| 2009/0104777 | A1 | 4/2009 | Kim | | | |
| 2009/0155997 | A1 | 6/2009 | Shinriki | | | |
| 2009/0163024 | A1 | 6/2009 | Kim et al. | | | |
| 2009/0209101 | A1 | 8/2009 | Shinriki et al. | | | |
| 2010/0055433 | A1 | 3/2010 | Shinriki et al. | | | |
| 2010/0099904 | A1 | 4/2010 | Dupau et al. | | | |
| 2011/0020546 | A1 | 1/2011 | Hamalainen et al. | | | |

FOREIGN PATENT DOCUMENTS

| | | |
|---|---|---|
| DE | 102008026284 | 12/2009 |
| EP | 0 469 456 | 7/1991 |
| EP | 0 469 470 A1 | 2/1992 |
| EP | 0 880 168 A2 | 11/1998 |
| EP | 1 688 923 A2 | 8/2006 |
| GB | 368850 | 12/1930 |
| GB | 1518243 | 7/1978 |
| GB | 2340508 A | 2/2000 |
| JP | 1998-340994 | 12/1998 |
| JP | 2003-168738 A | 6/2003 |
| KR | 10-2001-004717 | 1/2001 |
| KR | 10-2001-004718 | 1/2001 |
| KR | 10-2001-004719 | 1/2001 |
| KR | 10-2001-96408 | 11/2001 |

OTHER PUBLICATIONS

Jeong et al., Plasma enhanced atomic layer deposition of Ru-TaN thin films for the application of Cu diffusion barrier, ALD Conference, 2006, pp. 1-23.

Aaltonen et al., "Ruthenium Thin Film Grown by Atomic Layer Deposition," Chem. Vap. Deposition, 9[1], 45, 2003.

Aoyama Tomonori., et al., "Ruthenium Films Prepared by Liquid Source Chemical Vapor Deposition Using Bis-(ethylcyclopentadienyl)ruthenium". Jpn. J. Appl. Phys., vol. 38 (1999) pp. L1134-L1136.

Hur'Yeva, Tetyana, et al., "Ruthenium Films Deposited by Liquid-Delivery MOCVD using Bis(ethylcyclopentadienyl)ruthenium with Toulene as the Solvent". Chemical Vapor Deposition 2006, 12, pp. 429-434.

Kadota, Takumi et al., "Ruthenium Films Deposited under H2 by MOCVD using a Novel Liquid Precursor". IEEE article, pp. 175-176, no date available.

Onda et al., "DC-Hydrogen Plasma Cleaning a Novel Process for IC-Packaging", Semicon West 97, Packagin Materials Conference, 1997, pp. D-1-D-10.

Park et al., "Metalorganic Chemical Vapor Deposition of Ru and RuO2 using Ruthenocene Precursor and Oxygen Gas," J.Electrochem. Soc., 147[1], 203, 2000.

Tung et al., Atomic Layer Deposition of Noble Metals: Exploration of the low limit of the deposition temperature, J. Mater. Res., vol. 19, No. 11, p. 3353-3357 (Nov. 2004).

U.S. Appl. No. 10/728,126, filed Dec. 3, 2003, Granneman.

U.S. Appl. No. 11/367,177, filed Mar. 3, 2006, Shinriki et al.

U.S. Appl. No. 11/469,828, filed Sep. 1, 2009, Shinriki et al.

U.S. Appl. No. 11/557,891, filed Nov. 8, 2006, Shinriki et al.

U.S. Appl. No. 11/972,081, filed Jan. 10, 2008, Koh.

Kawaguchi, MPEG1 Decoder LSI for Video CD mPD61012NEC Device Technology International, NEC Device Technology International, New Products, Jan. 1998, vol. 5, Issue 48, pp. 4-8.

Se-Hum Kwon et al., "Plasma-Enhanced Atomic Layer Deposition of RuTiN thin films for the Application of Copper Diffusion Barrier" ALD Conference 2004.

Stephen Rossnagel, "The latest on Ru-Cu interconnect technology," Solid State Technology, Feb. 2005, Online, pp. 1-4.

C.-C. Yang et al., Physical, Electrical, and Relaiability Characterization of Ru for Cu Interconnects, 2006 International Interconnect Technology Conference, pp. 187-190, ISBN 1-4244-0103-8/06, 2006 IEEE.

K. Namba et al., PEALD of Ru layer on WNC ALD barrier for Cu/porous low-k, Proceedings of Advanced Metallization Conference 2006, p. 39.

I. Shao et al., An alternative low resistance MOL technology with electroplated rhodium as contact plugs for 32nm CMOS and beyond, 1-4244-1070-3/07, 2007 IEEE.

V. Arnal et al., Materials and processes for high signal propagation performance and reliable 32 nm node BEOL., 1-4244-1069-X/07, 2007 IEEE, pp. 1-3.

Shinriki et al., Method for Forming Ta-Ru Liner Layer for Cu Wiring, U.S. Appl. No. 11/955,275, filed Dec. 12, 2007.

Shinriki, Method for Forming Ruthenium Complex Film Using B-Diketone-Coordinated Ruthenium Precursor, U.S. Appl. No. 12/203,405, filed Sep. 3, 2008.
U.S. Appl. No. 10/782,727, filed Feb. 18, 2004, Lindfors et al.
U.S. Appl. No. 11/254,071, filed Oct. 18, 2005.
U.S. Appl. No. 11/955,275, filed Dec. 12, 2007, Shinriki.
U.S. Appl. No. 12/129,345, filed May 29, 2008, Shinriki et al.
U.S. Appl. No. 12/201,434, filed Aug. 29, 2008, Shinriki et al.
U.S. Appl. No. 12/337,141, filed Dec. 17, 2008, Kim et al.
U.S. Appl. No. 60/976,378, filed Sep. 28, 2007, Shinriki, H.
U.S. Appl. No. 61/178,871, filed May 15, 2009, Hamalainen et al.
Aaltonen et al. "Atomic Layer Deposition of Ruthenium Thin Films from Ru(thd)3 and Oxygen," Chem. Vap. Deposition, 10, pp. 25-219, 2004.
Aaltonen et al. "Reaction Mechanism Studies on Atomic Layer Deposition of Ruthenium and Platinum," Electrochem. Solid-State Lett., 6 (2003), C130-133.
Aaltonen et al., "ALD of Rhodium Thin Films from Rh (acac)$_3$ and Oxygen," Electrochem. Solid-State Lett. 8 (8): C99-C101 (2005).
Aaltonen et al., "Atomic Layer Deposition of Iridium Thin Films," J. Electrochem. Soc. 151(8): G489-G492 (2004).
Aaltonen et al., "Atomic Layer Deposition of Noble Metal Thin Films," dissertation presented at the University of Helsinki, Helsinki, Finland, 2005.
Aaltonen et al., "Atomic Layer Deposition of Noble Metals: Exploration of the Low Limit of the Deposition Temperature," J. Mat. Res. Soc. 19 (11): 3353-3358 (2004).
Aaltonen et al., "Atomic Layer Deposition of Platinum Thin Films," Chem. Mater. 15: 1924-1928 (2003).
Ackerman et al., "Identifying Tunneling in Ferromagnetic-Insulator-Ferromagnetic Thin Film Structures," World Wide Web, physics. ucsd.eduik sgrp/Tunneling.html, pp. 1-6.
Addison et al., "The Vapour Pressure of Anhydrous Copper Nitrate, and its Molecular Weight in the Vapour State," J. Chem. Soc., pp. 3099-3106 (1958).
Aoyama et al., "Chemical Vapor Deposition of Ru and Its Application in (Ba, Sr) TiO$_3$ Capacitors for Future Dynamic Random Access Memories," Jpn. J. Appl. Phys. 38(43): 2194-2199 (1999).
Baklanov et al., "Characterization of Cu surface cleaning by hydrogen plasma," Journal Vac. Sci. Technol 19(4): 1201-1211 (2001).
Balgia, J., Associate Editor, "New designs and materials tackle 1 Gb memory challenges," Semiconductor International, World Wide Web address: semiconductor.net, Nov. 2000.
Basceri, C. Ph.D. thesis, "Electrical and Dielectric Properties of (BA,SR) TiO$_3$ Thin Film Capacitors for Ultra-High Density Dynamic Random Access Memories," 1997, pp. 13-31, Raleigh, N.C. State University.
Bobo et al., Spin Dependent Tunneling Junctions with Hard Magnetic Layer Pinning, Journal of Applied Physics, vol. 83. No. 11, pp. 6685-6687, (1998).
Bursky, "Hit Up IEDM for Gigabit and Denser DRAMs and Merged Logic/Memory," Electronic Design, World Wide Web address: planetee.com, Dec. 1, 1998.
Campbell et al., "Titanium dioxide (TiO2)-based gate insulators," IBM J. Res. Develop., May 1999, pp. 383-392, vol. 43, No. 3.
Daughton, World Wide Web nve.com/otherbiz/mram2.pdf "Advanced MRAM Concepts," p. 1-6, (Feb. 7, 2001).
Fereday et al., "Anhydrous Cobalt (III) Nitrate," Chemical Communications, p. 271 (1968).
Fukuzumi et al., "Liner-Supported Cylinder (LSC) Technology to Realize Ru/Ta$_2$O$_5$/Ru Capacitor for Future DRAMs," IEEE, IED 2000, Session 34 (2000).
Fullerton et al., "Advanced Magnetic Recording Media for High-Density Data," Solid State Technology 44(i9): 87 (2001).
Hones et al., "MOCVD of Thin Ruthenium Oxide Films: Properties and Growth Kinetics," Chem. Vap. Deposition 6(4): 193-198 (2000).
Hu et al., "In situ rapid thermal oxidation and reduction of copper thin films and their applications in ultralarge scale integration," Journal of the Electrochemical Society 148(12): G669-G675 (2001).
Imai, Tajuki World Wide Web nikkeibp.asiabiztech.com/nea/ 200008/tech_108675.html, "100 Gbit/Inch HDD Just Around the Corner," p. 1-6, (Aug. 2000).

Inoue et al., "Low thermal-budget fabrication of sputtered-PZT capacitor on multilevel interconnects for embedded FeRAM," IEEE, IED 2000, 2000, Session 34.
Integrated Circuit Engineering Corporation, Practical Integrated Circuit Fabrication Seminar (1998).
Jung et al., "A Novel Ir/IrO$_2$/Pt-PZT-Pt/IrO$_2$/Ir Capacitor for a Highly Reliable Mega-Scale FRAM," IEEE, IED 2000, Session 34 (2000).
Kawamoto et al., "The Outlook for Semiconductor Processes and Manufacturing Technologies in the 0.1-µm Age," Hitachi Review 48(6): 334-339 (1999).
Kwon et al., "Ruthenium Bottom Electrode Prepared by Electroplating for a High Density DRAM Capacitor," J. Electrochem. Soc. 151(2): C127-C132 (2004).
Kwon, et al., "Plasma-enhanced Atomic Layer Deposition of Ruthenium Thin Films", Electrochemical and Solid-State Letters, 7(4), C46-C48 (2004).
Lee et al., "Electroless CoWP boosts cooper reliability, device performance," Semiconductor International, Jul. 1, 2004, 5 pages.
NEC Device Technology International, "Current state of leading edge ULSI process technology and future trends," No. 48, pp. 4-8 (1998).
Nilsen et al. ,"Thin Film Deposition of Lanthanum Manganite Perovskite by the ALE process," Journal of Materials Chemistry, vol. 9, 1781-1784, (1999).
Onda et al., "Hydrogen plasma cleaning a novel process for IC-packaging," SEMICON West 97, Packaging Materials Conference, 1997, pp. D-1-D-10. (alternative source: p. 311, World Wide Web Address: Semiconductor Fabtech.com, 1998.).
Pakrad, "Pure Tech: Growth of MR/GMR Head Materials," World Wide Web, Puretechinc.com/tech_papers/tech_papers-4.htm, pp. 1-2, (1999).
Paranjpe et al., Atomic Layer Deposition of AlOx for thin Film Head Gap Applications, Journal of Electrochemical Society, V 148 (9), G465-G471, 2001.
Parsons et al., "Microcontact Patterning of Ruthenium Gate Electrodes by Selective Area," North Carolina State university, presentation at AVS conference on Atomic Layer Deposition (ALD 2004), Helsinki, Finland, Aug. 16, 2004.
Ritala et al., "Atomic Layer Deposition," Handbook of Thin Film Materials vol. 1: Deposition and Processing of Thin Films, chapter 2, pp. 103-159 (2002).
Sakurai et al., "Adsorption of ruthenium tetroxide on metal surfaces," J. Phys. Chem. American Chemical Society, vol. 89, pp. 1892-1896 (1985).
Satta et al., "The Removal of Copper Oxides by Ethyl Alcohol Monitored in Situ by Spectroscopic Ellipsometry," Journal of the Electromechanical Society, 150 (5), pp. 300-306 (2003).
Singer, Peter, "Progress in Copper: A Look Ahead", Semiconductor International, May 1, 2002.
SOI Technology: IMB's Next Advance in Chip Design, 1998.
Solanki et al., "Atomic Layer Deposition of Copper Seed Layers," Electrochemical and Solid-State Letters 3(10): 479-480 (2000).
Sundani et al., "Oral Presentation of Dual Damascene Process," slides, Nov. 19, 1998.
Suntola, "Atomic Layer Epitaxy," Handbook of Crystal Growth, vol. 3, chapter 14, pp. 601-663 (1994).
Ueno et al. Cleaning of CHF3 plasma-etched SiO2/SiN/Cu via structures using a hydrogen plasma, an oxygen plasma and hexafluoracetylacetone vapors, J. Vac. Sci. Technology B vol. 16, No. 6, pp. 2986-2995 (1998).
Utriainen et al., "Studies of metallic thin film growth in an atomic layer epitaxy reactor using M(acac)$_2$ (M=Ni, Cu, Pt) precursors," Applied Surface Science 157: 151-158 (2000).
Utriainen et al., "Studies of NiO thin film formation by atomic layer epitaxy," Materials Science and Engineering B54: 98-103 (1998).
Wang, Shan X. "Advanced Materials for Extremely High Density Magnetic Recording Heads," Department of Materials Science and Engineering, Department of Electrical Engineering, Stanford University, Stanford, CA 94305-4045, presentation.
Winbond News Release, "Successful development of capacitor technology for next generation memory," World Wide Web address: winbond.com, Dec. 13, 2000.

Won et al., "Conformal CVD-ruthenium process for MIM capacitor in giga-bit DRAMs," IEEE, IED 2000, Session 34 (2000).

World Wide web, magahaus.com/tech/westerndigital/shitepapers/gmr_wp.shtml, "GMR Head Technology: Increased Areal Density and Improved Performance Areal Density," pp. 1-4, (Feb. 2000).

World Wide Web, pc.guide.com/ref/hdd/op/heads/techGMR-c.html, "Giant Magnetoresistive (GMR) Heads," pp. 1-4.

World Wide web, semiconductor.net/semiconductor/issues/Issues/1998/feb98/docs/emerging.asp, "GMR Read-Write Heads Yield Data Storage Record," pp. 1-2 (Feb. 1998).

World Wide Web, stoner.leeds.ac.uk/research/gmr.htm, "Giant Magnetoresistance," pp. 1-6.

Xu et al., "A breakthrough in low-k barrier/etch stop films for copper damascene applications," Semiconductor Fabtech, 2000, pp. 239-244, 11th Edition.

Yagishita et al., "Cleaning of Copper Surface Using Vapor-Phase Organic Acids," MRS Proceedings, vol. 766, MRS Spring 2003 Meeting, Apr. 21-25, 2003, Symposium E, Session E3, Paper E3.28.

Yoon et al., "Development of an RTA process for the enhanced crystallization of amorphous silicon thin film," Electrochemical Society Proceedings 2000-9: 337-343 (2000).

Yoon et al., "Investigation of $RuO_2$-incorporated Pt layer as a Bottom Electrode and Diffusion Barrier for High Epsilon Capacitor Applications," Electrochemical and Solid-State Letters 3(8): 373-376 (2000).

Yoon et al., "Tantalum-ruthenium dioxide as a diffusion barrier between Pt bottom electrode and $TiSi_2$ ohmic contact layer for high density capacitors," Journal of Applied Physics 86(5): 2544-2549 (1999).

Yoon, Y.-G. et al., 197th Meeting Program Information II, The Electrochemical Society, 197th Meeting—Toronto, Ontario, Canada, May 14-18, 2000, Program Information, I1—Rapid Thermal and Other Short-Time Processing Technologies I, Electronics Division/Dielectric Science and Technology Division/High Temperature Materials Division, 2000, Wednesday, May 17, 2000, New Applications of RTP, Co-Chairs: A. Fiory and D.-L Kwong, time 11:10 Abs#550, Title: Development of RTA Process for the Crystallization of a-Si Thin Film—Y.-G. Yoong, T.-K. Kim, K.-B. Kim J.-Y. Chio, B.-I. Lee, and S.-K. Joo (Seoul National Univ.).

* cited by examiner

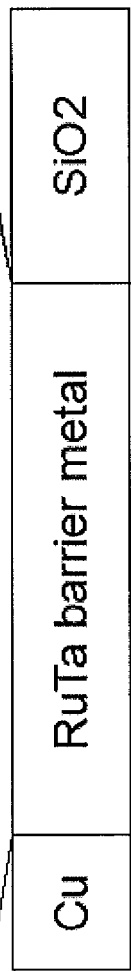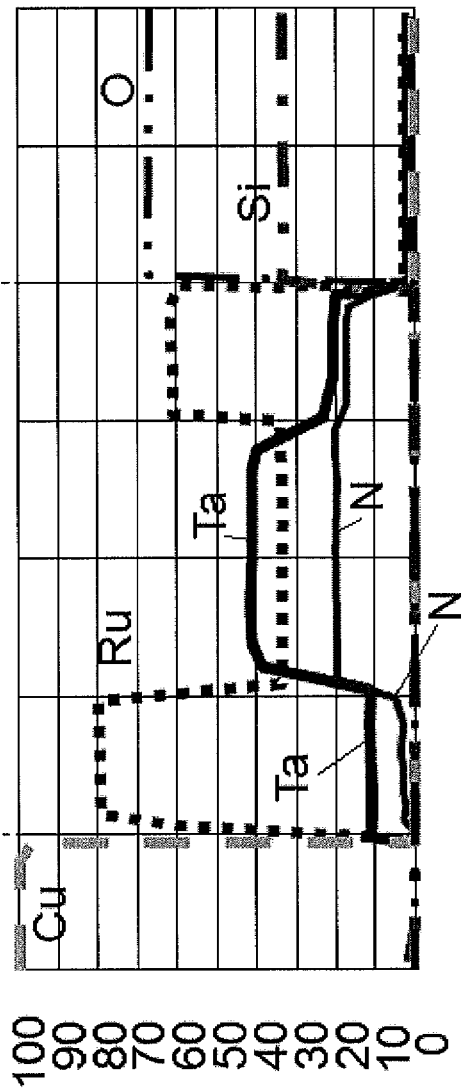
Fig.2

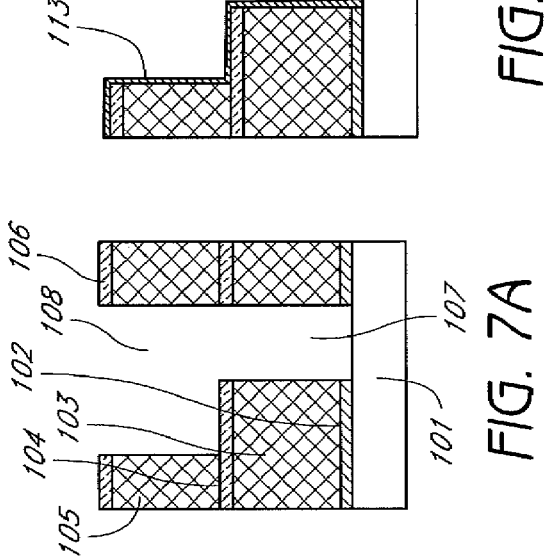
FIG. 7D
FIG. 7F
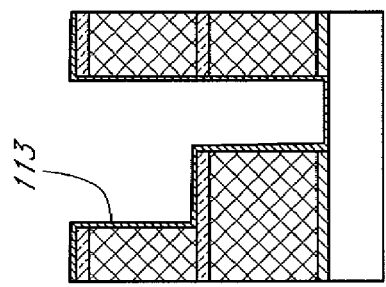
FIG. 7C
FIG. 7E
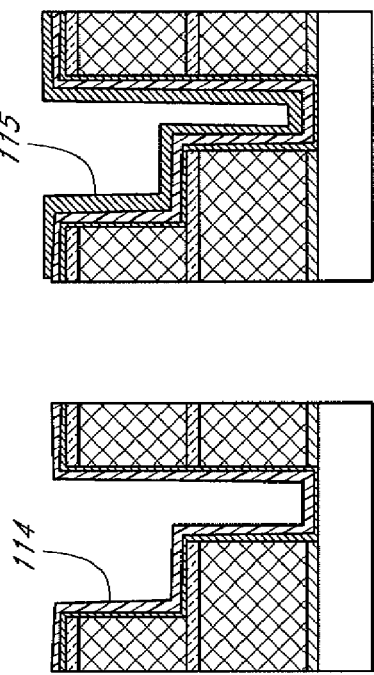
FIG. 7B
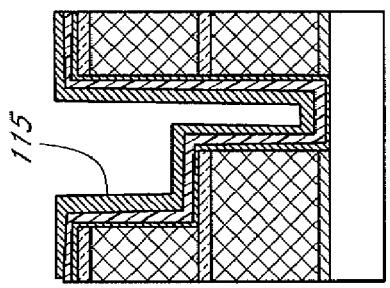
FIG. 7A

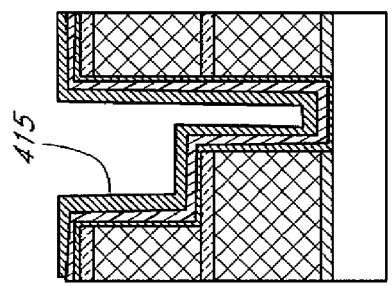
FIG. 8B
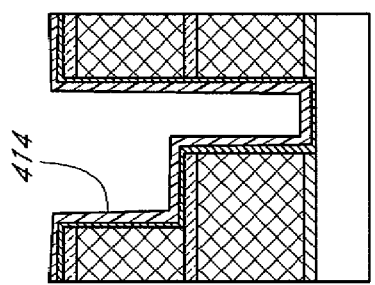
FIG. 8C
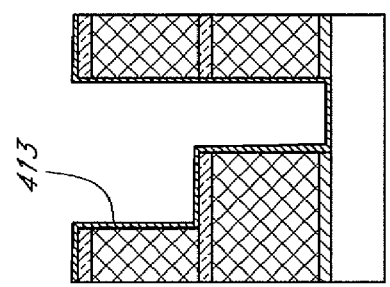
FIG. 8D
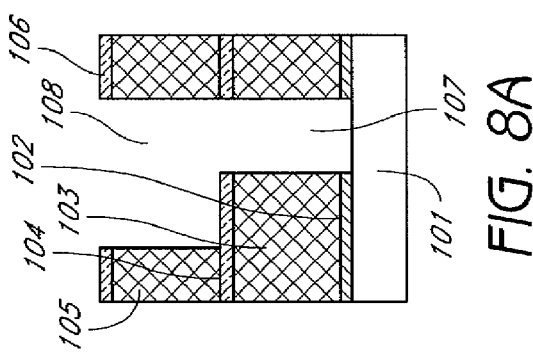
FIG. 8A
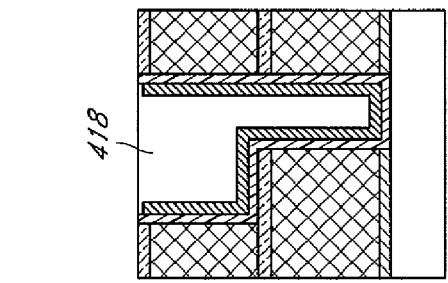
FIG. 8E
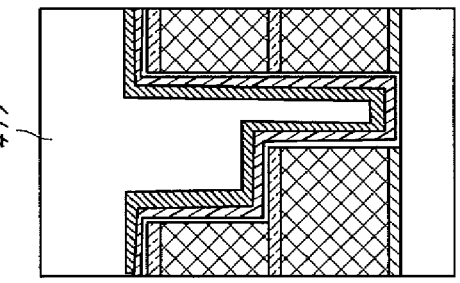
FIG. 8F
FIG. 8G

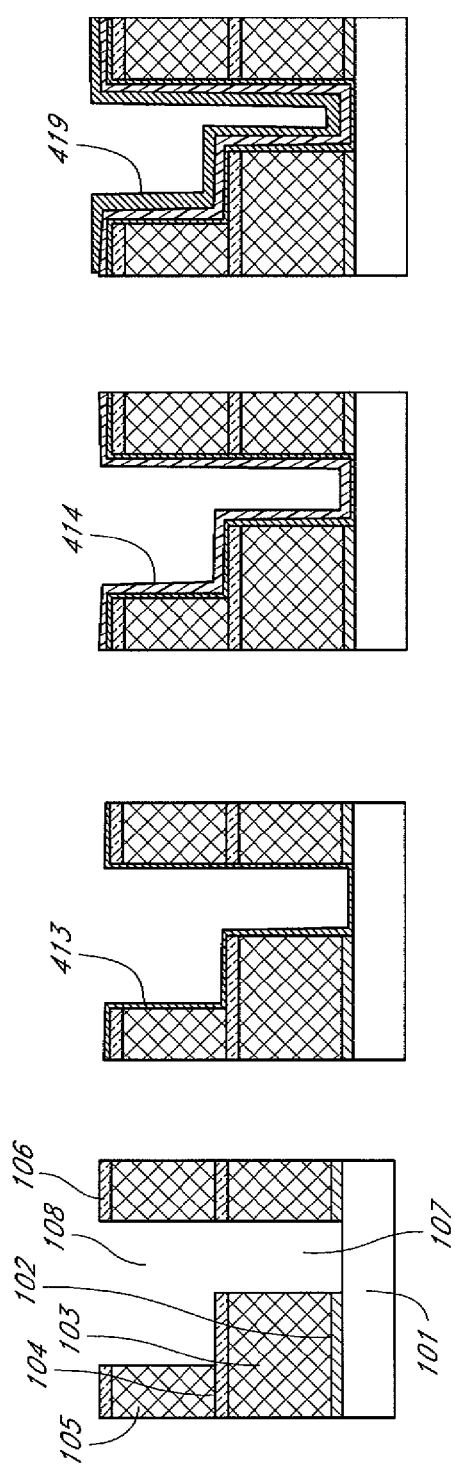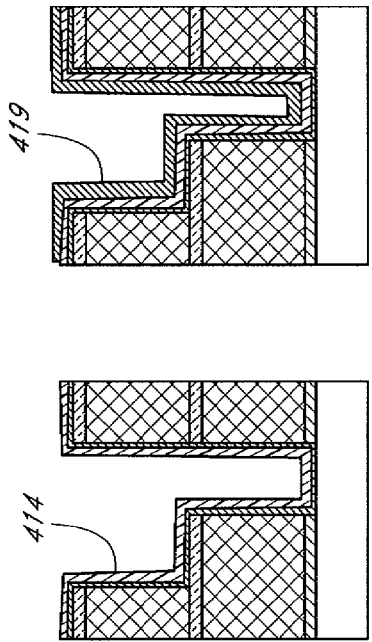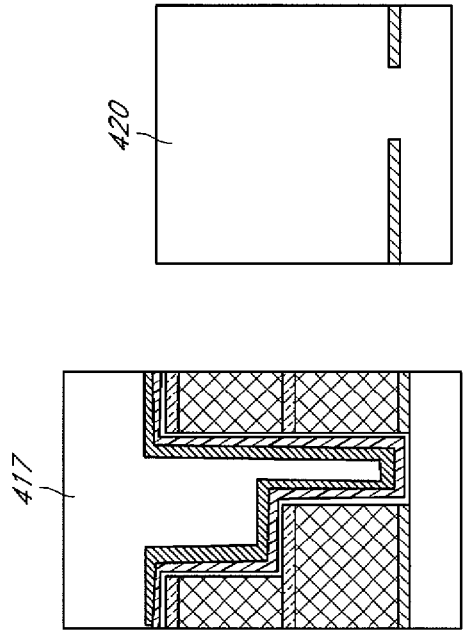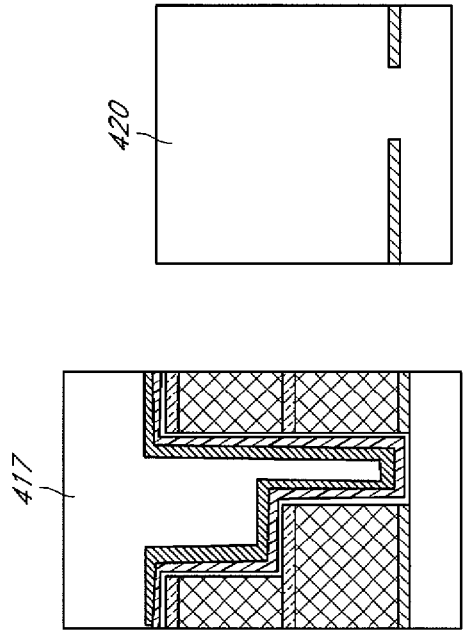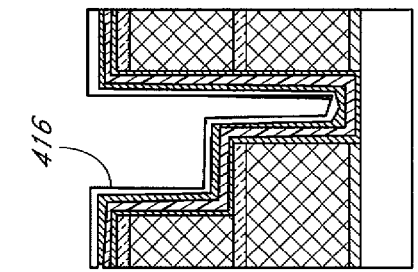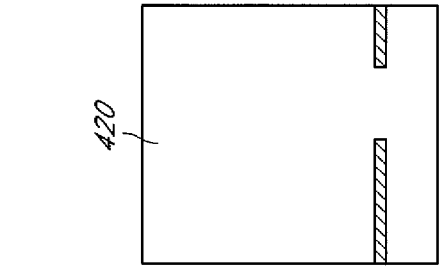

ATOMIC COMPOSITION CONTROLLED RUTHENIUM ALLOY FILM FORMED BY PLASMA-ENHANCED ATOMIC LAYER DEPOSITION

BACKGROUND

1. Field of the Invention

The present invention relates to a method for forming a Cu diffusion barrier metal for metal wiring structures that can be favorably used in the creation of fine semiconductor elements in general, as well as a structure of such Cu diffusion barrier metal.

2. Description of the Related Art

Ru film is drawing the attention for its property to improve the adhesion with Cu, when a Ru film is formed at the interface between Cu and barrier metal in a Cu wiring structure which is the main wiring structure used in high-speed logic elements such as MPUs, and thereby significantly enhance the reliability of wiring. Methods are being studied to form a Ru film that provides a Cu wiring liner on a TaN film or WN film and then form a Cu film on top of the Ru film (one example of such method relating to a combination of Ru and TaN is described in C. C. Yong et al., "Physical, Electrical, and Reliability Characterization of Ru for Cu Interconnects," IITC 2006, pp. 187-189).

A Ru/TaN laminated film, whose utilization as a Cu wiring liner is being examined, has a smaller Cu wiring volume as the film becomes thicker, and as a result the Cu wiring resistance tends to become higher. Accordingly, any attempt to reduce the high resistivity resulting from the reduced Cu wire size due to a smaller wiring width requires the Cu wiring liner film to be made thinner. As a result, the industry is paying attention to the atomic layer deposition method, which can be used to form a film offering greater coverage than when the conventional PVD method is used.

When it comes to adhesion, traditionally the PVD method causes physically accelerated ions to strike the surface and therefore a PVD-Ta film or PVD-TaN film constituting a Cu liner can be formed in a manner similar to driving in a wedge. This means that even when a PVD-TaN film is formed on a Cu film of bottom-layer wiring, the TaN film is formed in a manner biting into the Cu film and consequently good adhesion can be achieved. On the other hand, it has been confirmed that a TaN film formed by the atomic layer deposition method would result in lower adhesion with Cu wiring. When a film is formed by means of chemical reaction, unlike when PVD is used an area where different atoms are mixed is not formed between the Cu wiring in the bottom layer and the metal film constituting a Cu liner. This makes it more difficult, than under the PVD method, to ensure good adhesion when a TaN film or TaNC film is formed as a Cu barrier metal. It is expected that good adhesion can be achieved by inserting a Ru film between a Cu film and TaN film or TaNC film.

When forming a multilayer Cu wiring structure, many via holes need to be formed as connection holes with which to connect the top and bottom Cu wirings. Since a dual damascene structure is used in general, the following explanation assumes use of a dual damascene structure. A Cu barrier film is formed on Cu wiring via holes and trenches in the bottom layer, and then a Cu wiring is formed. This is to prevent diffusion of Cu into the inter-layer insulation film and consequent increase in leak current and failed insulation. If the adhesion of Cu with this Cu barrier metal is poor, however, the Cu film will separate in the reliability test and voids will be formed. Accordingly, it is desirable to form a Ru film at the interface between Cu wiring and Cu barrier metal as shown in published examples. However, traditionally forming a Ru film was difficult over the exposed areas of Cu wiring at the bottom of via holes because normally the adhesion is poor at the interface between inter-layer insulation film and Ru. As a way to solve this problem, Se-Hum Kwon presented a paper entitled, "Plasma-Enhanced Atomic Layer Deposition of RuTiN Thin Films for the Application of Copper Diffusion Barrier" at ALD Conference 2004. In this paper, Kwon showed that by adding Ru to a TiN film traditionally used as a copper diffusion barrier film, adhesion with copper could be improved. Hynix Semiconductor Inc. also describes in U.S. Pat. No. 6,800,567 a method for forming a RuTiN film or RuTaN film as a barrier metal film by means of the atomic layer deposition method, where it is self-evident that RuTaN can also be used as a Cu diffusion barrier in a similar manner. In addition, Seong-Jun Jeong et al. presented a paper entitled, "Plasma-Enhanced Atomic Layer Deposition of Ru—TaN Thin Films for the Application of Cu Diffusion Barrier" at ALD Conference 2006. In this paper, Jeong et al. proposed forming a metal alloy film constituted by Ta and Ru between the bottom-layer Cu film and top-layer Cu film by repeating a step to introduce Ta material, step to purge Ta material, step to introduce hydrogen gas and apply high-frequency plasma, step to purge hydrogen gas, step to introduce Ru material $(Ru(EtCp)_2)$, step to purge Ru material, step to introduce hydrogen and nitrogen gases and apply high-frequency plasma, and step to purge ammonia gas. In this case, the resulting formation of an alloy of Ta and Ru is shown to achieve good adhesion with the Cu films at the top and bottom and also with dielectric layers.

In addition, Korean Patent Application No. 10-2005-0103373 describes application, as a Cu barrier film, of a film containing amorphous Ru and Ta, wherein such film is formed by repeating the first atomic layer deposition process comprising a step to introduce Ru material, step to purge Ru material, step to introduce ammonia gas and apply high-frequency plasma and step to purge ammonia gas, as well as the second atomic layer deposition process comprising a step to introduce Ta material, step to purge Ta material, step to introduce hydrogen gas and apply high-frequency plasma and step to purge hydrogen gas.

On the other hand, U.S. Pat. No. 6,703,708 proposes a method for changing the Cu, W and N composition of a Cu barrier film in the depth direction, or specifically a method for changing the composition in the depth direction using the atomic layer deposition method in such a way that the Cu content increases at the surface and the W and N contents increase in the bottom layer.

SUMMARY

However, the prior arts mentioned above are associated with at least the problems explained below.

To be specific, the results of experiments conducted by the inventors of the present invention found it difficult to break down the materials and form a Ru film unless $NH_3$ plasma or $H_2/N_2$ mixed gas is used, if $Ru(EtCp)_2$ is used as an organic metal material containing Ru metal atoms as described in the paper by Seong-Jun Jeong et al. However, use of $NH_3$ plasma or $H_2/N_2$ plasma promotes nitriding of the Ta layer formed as the bottom layer, resulting in significantly high film resistivity. In other words, Ta is nitrided by ammonia plasma and a high-resistivity film whose high-resistivity component of $Ta_3N_5$ is greater or which has a relatively high nitrogen content will be formed. Accordingly, applying the present invention to via holes connecting the top-layer Cu wiring layer and bottom-layer Cu wiring, which is the object of the aforementioned published example, will significant increase the via resistance and result in loss of reliability of wiring.

In addition, the amount of Ru needs to be increased to lower the wiring resistance, and therefore the adhesion with the insulation film tends to drop as the amount of Ru increases. Particularly when a Ru film is used as a Cu wiring liner, the interface in the bottom layer contacts both Cu and the inter-layer insulation film, while the interface in the top layer only contacts the Cu wiring. These differences make it difficult to achieve good adhesion at the top and bottom interfaces based on the same film quality.

Korean Patent Application No. 10-2005-0103373 also presents a problem of increased resistivity due to nitriding of Ta by $NH_3$ plasma. As is the case with the aforementioned paper by C. C. Yong et al., it is difficult to achieve good wiring reliability relative to both the top layer and bottom layer using only an alloy having a specific composition of amorphous Ta and Ru, because Ru provides good adhesion with copper in the top layer, while TaN provides good adhesion with the inter-layer insulation film in the bottom layer. Even if an alloy film of Ta and Ru film is proven effective as a copper diffusion barrier, voids tend to form as the barrier film and Cu film separate or the barrier film and inter-layer insulation film separate as electrical current flows. Therefore, it is desirable to have a structure that ensures adhesion with the Cu wiring in the bottom layer, provides excellent Cu diffusion barrier property, and also maintains good adhesion with the Cu wiring in the top layer.

Also, the object of U.S. Pat. No. 6,703,708 is to achieve a film that functions as both a seed layer and barrier layer for Cu electroplating, and this is why Cu is added intentionally. Accordingly, even when the film functions as a Cu barrier film, it is difficult to make the film thinner because Cu is contained in the film. In other words, the thinner the film becomes, the higher the chances are that Cu in the film diffuses into the bottom layer. Therefore, it is desirable to use a non-Cu metal that contributes to resistance reduction, such as Ru.

In view of the above, the inventors examined combinations of Ta material and Ru material. In particular, the inventors examined materials that can be broken down by $H_2$ plasma or $H_2/N_2$ plasma. Furthermore, the inventors examined an optimal composition in the depth direction of a film made by these materials, and a method for controlling such composition, in order to ensure adhesion and barrier property of the film as a Cu wiring liner. In an embodiment of a method for forming a RuTaN film being a Cu barrier film, combining Ta material with $H_2/N_2$ plasma, and Ru material with $H_2/N_2$ plasma, is effective. A stable RuTaN film can be formed by increasing the flow rate ratio of $N_2$ or adjusting the $H_2/N_2$ plasma time. If $H_2$ plasma is applied after the supply of Ta material, the residual carbon content in the film increases, thereby resulting in lower density and higher resistance. When $H_2/N_2$ plasma is applied, on the other hand, the resistance becomes lower and the residual carbon content decreases. Accordingly, it is effective to use plasma of $H_2/N_2$ mixed gas after the supply of Ta material. In the meantime, in an embodiment a RuTa film containing less N can be formed by combining Ta material with $H_2/N_2$ plasma, and Ru material with $H_2$ plasma. In this case, the resistivity can be lowered by reducing the N content, and also stable resistivity can be achieved according to the $H_2$ plasma conditions. To be specific, the residual carbon content drops due to $H_2/N_2$ gas plasma applied after the supply of Ta material, and the nitrogen content can also be reduced by hydrogen plasma applied after the supply of Ru material, which allows for formation of a RuTa alloy offering lower resistance.

The aforementioned method is effective when specific Ta and Ru materials are used. Particularly with the Ru material, use of a material that can easily be broken down by $H_2$ plasma is effective in controlling the N content. This is not possible with conventional $Ru(EtCp)_2$. An example of such effective material is one coordinated by two β-diketone groups. Accordingly, in an embodiment an optimal liner film in terms of adhesion, Cu barrier property and resistivity can be formed by plasma atomic layer deposition in a single process that can be carried out continuously in the same reaction apparatus, by using these effective materials along with the aforementioned plasma step and by also controlling the composition of the film in the depth direction in a manner appropriate for a Cu wiring liner film. In other words, the adhesion with the Cu wiring in the bottom layer, adhesion with the Cu wiring in the top layer, and Cu diffusion barrier property can be further optimized by controlling the composition of Ru, Ta and N in the depth direction.

As explained above, one characteristic of a Cu barrier metal film obtained in an embodiment of the present invention is that it is 1) a RuTa alloy having an optimal distribution of Ru, Ta and N compositions to ensure the level of adhesion with the top/bottom layers and Cu barrier property required of a Cu liner. Another characteristic in terms of controlling the composition of Ru and Ta is that 2) optimal Ta and Ru materials that can be made into a film using hydrogen plasma or hydrogen/nitrogen plasma are identified and the Ta material is treated by $H_2/N_2$ plasma, while the Ru material is treated by $H_2$ plasma or $H_2/N_2$ plasma, each under a controlled pulse ratio, to control Ru and Ta compositions in the depth direction. Another characteristic is that 3) the N content is controlled in the depth direction by using hydrogen/nitrogen plasma for Ta material, and using hydrogen plasma or $H_2/N_2$ plasma for Ru material.

By utilizing inventions 1), 2) and 3) mentioned above, a Cu barrier metal film constituted by RuTa can be provided, wherein such film maintains adhesion, Cu barrier property and low resistivity in next-generation, fine, highly integrated Cu wiring structures having high aspect ratios, and has its composition controlled in the depth direction through plasma atomic layer deposition to ensure excellent coverage.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not to scale.

FIG. 2 is an overview showing the distribution (2) in the depth direction of compositions of a Cu wiring metal liner film used in an embodiment of the present invention.

FIGS. 7(a) to (f) show a Cu wiring forming process based on dual damascene, using the Cu barrier metal film shown in FIG. 1.

FIGS. 8(a) to (g) show a Cu wiring forming process based on dual damascene, using the Cu barrier metal film shown in FIG. 2.

FIGS. 9(a) to (g) show a Cu wiring forming process based on dual damascene, using the Cu barrier metal film shown in FIG. 3.

DESCRIPTION OF THE SYMBOLS

Figure 1:
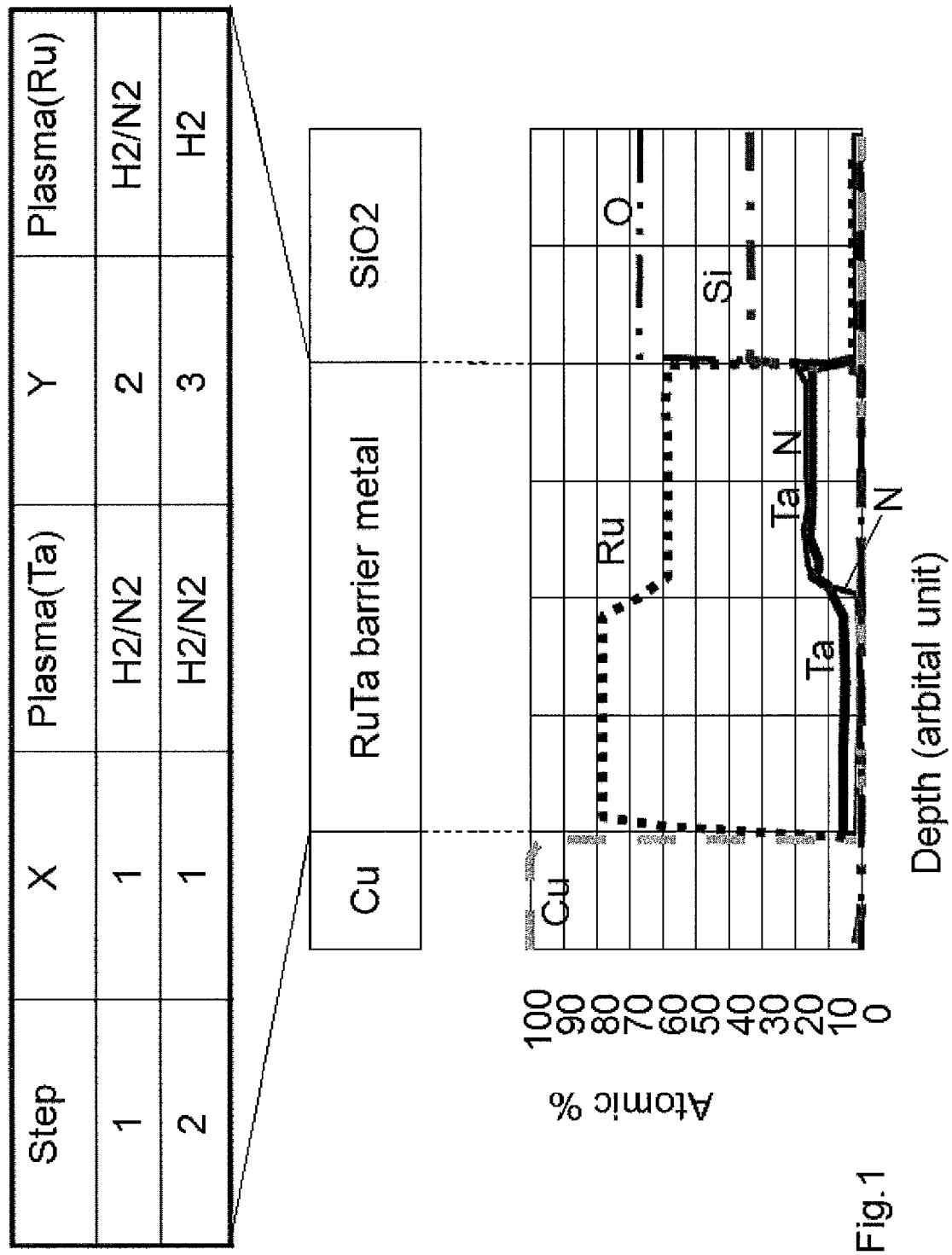
FIG. 1 is an overview showing the distribution (1) in the depth direction of compositions of a Cu wiring metal liner film used in an embodiment of the present invention.
Figure 3:
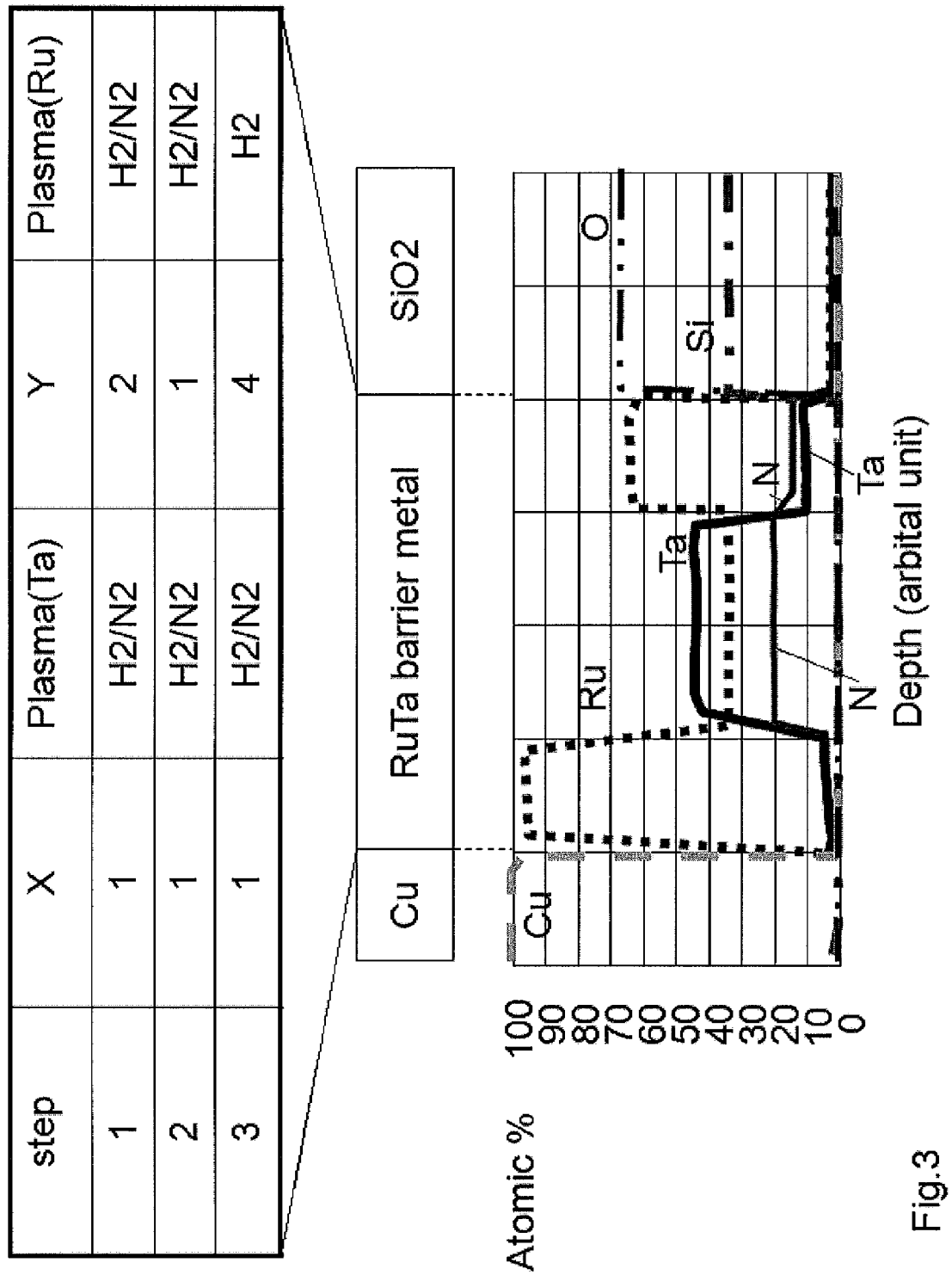
FIG. 3 is an overview showing the distribution (3) in the depth direction of compositions of a Cu wiring metal liner film used in an embodiment of the present invention.

| | Detailed Description of Embodiments |
|---|---|
| 101: | Bottom-layer copper wiring |
| 102: | SiCN Cu diffusion barrier insulation film |
| 103: | Inter-layer insulation film |
| 104: | Etching stop film |
| 105: | Inter-layer insulation film |
| 106: | Etching stop film |
| 107: | Dual damascene via hole |
| 108: | Dual damascene trench |
| 113: | Film formed in Step 1 |
| 114: | Metal film conforming to Step 1 in the table in FIG. 1 |
| 115: | Cu film by PVD method |
| 116: | Cu plating |
| 117: | Cu plating |
| 118: | Cu wiring |
| 301: | Reaction apparatus |
| 302: | Showerhead |
| 303: | Substrate heating base |
| 304: | Exhaust for evacuation |
| 305: | Pressure adjustment valve |
| 306: | Substrate |
| 307: | Gas introduction pipe connected to shower head |
| 308: | Argon gas valve for purge |
| 309: | Ta material introduction valve |
| 310: | Orifice |
| 311: | Argon gas valve for purge |
| 312: | Ru material carrier argon introduction valve |
| 313: | Orifice |
| 314: | Gas introduction valve |
| 315: | Orifice |
| 316: | Gas introduction valve |
| 317: | Orifice |
| 318: | Gas introduction valve |
| 319: | APR |
| 320: | MFC |
| 321: | Bypass valve |
| 322: | Ar gas introduction valve |
| 323: | Ru material |
| 324: | Ta material bottle |
| 325: | Ta material |
| 326: | APR |
| 327: | MFC |
| 328: | Bypass valve |
| 333: | APR |
| 334: | MFC |
| 335: | APR |
| 336: | MFC |
| 337: | APR |
| 338: | MFC |
| 413: | RuTa alloy formed in Step 1 in the table in FIG. 2 |
| 414: | RuTa alloy formed in Step 2 in the table in FIG. 2 |
| 415: | RuTa alloy formed in Step 3 in the table in FIG. 2 |
| 416: | Cu film by PVD method |
| 417: | Cu plating |
| 418: | Cu wiring |
| 419: | Ru conforming to Step 3 in the table in FIG. 3 |
| 420: | Cu wiring |
| 501: | Cassette loader |
| 502: | Transfer robot |
| 503: | Load lock chamber |
| 504: | Vacuum robot |
| 505: | Reaction chamber |
| 506: | Reaction chamber |
| 507: | Reaction chamber |
| 508: | Ar gas supply |
| 509: | Ru material supply |
| 510: | Ta material supply |
| 511: | Hydrogen gas supply |
| 512: | Ru material supply pipe |
| 513: | Ta material supply pipe |
| 514: | $H_2$ gas supply pipe |
| 515: | Nitrogen gas supply |
| 516: | Nitrogen gas supply pipe |

The present invention will be explained in detail with reference to specific embodiments. However, the specific embodiments are not intended to limit the present invention.

In an embodiment wherein one or more of the problems described above can be solved, a metal film composed of multiple atomic layers continuously formed by atomic layer deposition of Ru and Ta or Ti may be comprised of at least a top section and a bottom section, wherein (a) an atomic composition of Ru, Ta or Ti, and N varies in a thickness direction of the metal film, (b) the atomic composition of Ru, Ta or Ti, and N in the top section is represented as $Ru_{(x1)}Ta/Ti_{(y1)}N_{(z1)}$ wherein an atomic ratio of $Ru_{(x1)}/(Ta/Ti_{(y1)})$ is no less than 15, and z1 is 0.05 or less, and (c) the atomic composition of Ru, Ta or Ti, and N in the bottom section is represented as $Ru_{(x2)}Ta/Ti_{(y2)}N_{(z2)}$ wherein an atomic ratio of $Ru_{(x2)}/(Ta/Ti_{(y2)})$ is more than zero but less than 15, and z2 is 0.10 or greater. In embodiments, the following ranges may be employed: $15 \leq Ru_{(x1)}/(Ta/Ti_{(y1)}) < \infty$ ($(Ta/Ti_{(y1)})=0$), $15 \leq Ru_{(x1)}/(Ta/Ti_{(y1)}) < 100$; $0.2 \leq Ru_{(x2)}/(Ta/Ti_{(y2)}) < 15$, $1 \leq Ru_{(x2)}/(Ta/Ti_{(y2)}) < 15$).

In an embodiment, the metal film may have the atomic composition wherein $0.75 \leq x1 \leq 1$ (typically 0.999 or less), $0 \leq y1 \leq 0.05$, $0 \leq z1 \leq 0.05$, $0.02 \leq x2 \leq 0.75$, $0.05 \leq y2 \leq 0.70$, and $0.10 \leq z2 \leq 0.25$. In another embodiment, the metal film may have the atomic composition wherein $0.75 \leq x1 \leq 0.99$, $0 \leq y1 \leq 0.05$, $0 \leq z1 \leq 0.05$, $0.40 \leq x2 \leq 0.75$, $0.05 \leq y2 \leq 0.40$, and $0.10 \leq z2 \leq 0.25$. In still another embodiment, x1 may be 0.75 to 0.85. In the above, the remainder may be carbon atoms.

In any of the foregoing embodiments, the atomic composition may satisfy x1>x2 and y2>y1. In any of the foregoing embodiments, the atomic composition may satisfy z2>z1.

In any of the foregoing embodiments, the atomic composition may be substantially or nearly constant in the thickness direction in each of the top and bottom sections.

In any of the foregoing embodiments, the top section and the bottom section may have a thickness of 1 to 3 nm.

In any of the foregoing embodiments, the metal film may further be comprised of an intermediate section, wherein the atomic composition of Ru, Ta or Ti, and N in the intermediate section is represented as $Ru_{(x3)}Ta/Ti_{(y3)}N_{(z3)}$ wherein an atomic ratio of $Ru_{(x3)}/(Ta/Ti_{(y3)})$ is less than one.

In an embodiment, the metal film may have the atomic composition wherein $0 \leq x3 \leq 0.40$, $0.40 \leq y3 \leq 0.90$, and $0.10 \leq z3 \leq 0.25$. In another embodiment, the the atomic composition wherein $0 \leq x3 \leq 0.30$, $0.40 \leq y3 \leq 0.80$, and $0.15 \leq z3 \leq 0.30$. In still embodiment, x3 may be at least 0.01.

In any of the foregoing embodiments, the metal film may have the atomic composition wherein $x1 > x2 > x3$ and $y3 > y2 > y1$. In any of the foregoing embodiments, the metal film may have the atomic composition wherein $z2 > z1$, and $z3 > z1$.

In any of the foregoing embodiments, the top section, the intermediate section, and the bottom section may have a thickness of 0.5 to 3 nm, 1 to 3 nm, and 0.5 to 3 nm, respectively.

In any of the foregoing embodiments, the atomic composition may be substantially or nearly constant in the thickness direction in each of the top, intermediate, and bottom sections.

In any of the foregoing embodiments, the metal film may be formed as a copper diffusion barrier metal film on a copper wiring layer and underneath a copper filling.

In an embodiment, the total thickness of the metal film may be 2 nm to 9 nm in view of the size of vias and trenches formed by dual damascene methods. The number of sections formed in the thickness direction is not limited to two or three but can be more than three (e.g., four or five), wherein each section has a different atomic composition.

In an embodiment, the ranges specified in any of the foregoing embodiments may include or exclude their endpoints.

In another aspect, an embodiment provides a method of forming a metal film on a substrate comprising: (i) placing a substrate in a reaction space; (ii) conducting atomic layer deposition of Ta or Ti X times, each atomic deposition of Ta or Ti being accomplished by introducing a Ta or Ti source gas into the reaction space and applying a reducing gas plasma to the reaction space; (iii) after step (ii), conducting atomic deposition of Ru Y times, each atomic deposition of Ru being accomplished by introducing a Ru source gas into the reaction space and applying a reducing gas plasma in the reaction space; and (iv) repeating steps (ii) and (iii) Z times, thereby forming a metal film on the substrate; wherein an atomic proportion of N in the metal film varies in a thickness direction of the metal film by changing a proportion of a hydrogen gas plasma in the reducing gas plasma within step (iii) or per step (iii) in step (iv).

In an embodiment, step (iv) may comprise: (iva) repeating steps (ii) and (iii) Z1 times wherein a ratio of X/Y is defined as a first ratio, thereby forming a first section of the metal film, and (ivb) repeating steps (ii) and (iii) Z2 times using a second ratio of X/Y which is different from the first ratio, thereby forming a second section of the metal film, wherein atomic proportions of Ru, Ta or Ti, and N in the metal film vary in the thickness direction.

In any of the foregoing embodiments, the reducing gas plasma in step (ii) may be generated from a reducing gas including nitrogen.

In any of the foregoing embodiments, the reducing gas plasma in step (iii) in step (iva) may be generated from a reducing gas including both nitrogen and hydrogen, and as the step of changing the proportion of the hydrogen gas plasma, the reducing gas plasma in step (iii) in step (ivb) may be generated from $H_2$ gas.

In any of the foregoing embodiments, the second ratio in step (ivb) may be greater than the first ratio in step (iva); step (iv) may further comprise (ivc) repeating steps (ii) and (iii) Z3 times using a third ratio of X/Y, which is smaller than the second ratio; and the reducing gas plasma in step (iii) in steps (iva) and (ivb) may be generated from a reducing gas including both nitrogen and hydrogen, and as the step of changing the proportion of the hydrogen gas plasma, the reducing gas plasma in step (iii) in step (ivc) may be generated from $H_2$ gas.

In an embodiment, X may be one or two, and Y may be an integer of 1 to 5. When X exceeds two or Y exceeds five, it may be difficult to form a Ru—Ta/Ti alloy.

In any of the foregoing embodiments, the Ta or Ti source gas may be an organic Ta source gas selected from the group consisting of TAIMATA (Tertiaryamylimidotris(dimethylamido)tantalum), TBTDET $(Ta(N-i-C_4H_9)[N(C_2H_5)_2]_3)$, and PDMAT $(Ta[N(CH_3)_2]_5)$.

In any of the foregoing embodiments, the Ru source gas may be a β-diketone-coordinated ruthenium compound. In another embodiment, the Ru source gas may be a Ru complex having a structure of Xa-Ru—Xb wherein Xa is a non-cyclic pentadienyl and Xb is a cyclopentadienyl.

In any of the foregoing embodiments, the substrate may be a copper wiring substrate having trenches.

The present invention is explained based on a RuTaN film. It should be noted, however, that the present invention also applies to a RuTiN in a similar manner, where Ti and Ta can be handled in a similar manner.

In an embodiment of a method for forming a RuTaN film effective as the bottom layer (bottom section), combination of Ta material with $H_2/N_2$ plasma, and Ru material with $H_2/N_2$ plasma, is effective. A stable RuTaN film can be formed by increasing the flow rate ratio of $N_2$ or adjusting the $H_2/N_2$ plasma time. Use of plasma of $H_2/N_2$ mixed gas after the supply of Ta material lowers the resistance and reduces the residual carbon content. On the other hand, as for a RuTa film effective as the top layer (top section) a film containing less N can be formed by combining Ta material with $H_2/N_2$ plasma, and Ru material with $H_2$ plasma, in an embodiment. In this case, the lower N content results in lower resistivity, and a stable resistivity can be achieved according to the $H_2$ plasma conditions. In other words, $H_2/N_2$ gas plasma applied after the supply of Ta material lowers the residual carbon content, and hydrogen plasma applied after the supply of Ru material reduces the flow rate of nitrogen, which allows for formation of a RuTa alloy of lower resistance.

In a continuous atomic layer deposition process it is possible to form a Ru layer by implementing the Ru material pulse step and $H_2/N_2$ plasma step continuously. Similarly, a TaN film can be formed by implementing the Ta material pulse step and $H_2$ plasma step or $H_2/N_2$ plasma step continuously. Accordingly, in an embodiment a Ru/RuTaN structure (two-layer structure whose top layer is constituted by a Ru film), RuTa/RuTaN structure (two-layer structure whose top layer is constituted by a Ru alloy containing virtually zero N), Ru/TaN/RuTaN structure (three-layer structure whose top layer is constituted by a Ru film and intermediate layer is constituted by a TaN film), or RuTa/TaN/RuTaN structure (three-layer structure whose intermediate layer is constituted by a TaN film), can be formed, among others. Optimal compositions of top and bottom layers can be selected from the viewpoint of adhesion with the top/bottom Cu wirings and inter-layer insulation film.

Also, combining Ta ($H_2/N_2$ plasma) and Ru ($H_2$ plasma) allows the carbon in the film to be reduced significantly, which enables the formation of a low-carbon film.

Examples of $H_2/N_2$ plasma and $H_2$ plasma conditions are shown below:
Pressure: 150 to 400 Pa
Temperature: 250 to 350 degrees
$H_2$ flow rate: 100 to 500 sccm
$N_2$ flow rate: 10 to 200 sccm
$H_2/N_2$ ratio: ∞ to 0.5
RF power: 250 to 500
RF frequency: 1 to 30 MHz
Application time: 1 to 20 (per cycle)

Among the above conditions, if the $H_2/N_2$ ratio is infinitely great (i.e., $N_2$=0), effectively $H_2$ plasma is applied. However, addition of even a very small amount of $N_2$ changes the film quality, and in an embodiment, the $H_2/N_2$ ratio is 1000 or greater and if $N_2$ increases beyond this ratio, effects equivalent or similar to what can be achieved by $H_2$ plasma will not be obtained.

In an embodiment, atomic compositions in the thickness direction are largely classified into the following four patterns:

Pattern 1: The Ru content is higher in the top layer than in the bottom layer and low in the bottom layer, while the Ta content is high in the bottom layer and low in the top layer of the film. (See FIG. 1 explained later.)

Pattern 2: The Ru content is higher in the bottom layer than in the intermediate layer of the film, low in the intermediate layer, and higher in the top layer than in the intermediate layer. On the other hand, the Ta content is low in the bottom layer, high in the intermediate layer, and lower in the top layer than in the intermediate layer. (See FIGS. 2 and 3 explained later.)

Pattern 3: The N content is high in the bottom layer, and lower in the top layer than in the bottom layer. (See FIG. 1 explained later.)

Pattern 4: The N content is lower in the top layer than in the intermediate layer and bottom layer. (See FIGS. 2 and 3 explained later.)

Among the above patterns, combination of patterns 1 and 3, and patterns 2 and 4, are realistic. However, the N content can still be changed under other patter combinations, as long as the composition ratio of Ru and Ta is maintained, in which case combination of patterns 1 and 4 (i.e., the Ru and Ta contents change in two layers, while the N content changes in three layers), or patterns 2 and 3 (i.e., the Ru and Ta contents change in three layers, while the N content changes in two layers), is also possible. In addition, the N content can be made higher in the intermediate layer as a variation of pattern 4.

When a metal film is used as a copper diffusion barrier film, N needs to be contained because a nitrided film is more effective in preventing copper diffusion, and accordingly a layer of relatively higher N content needs to be provided in the metal film. This layer can be provided as either the bottom layer or intermediate layer, but containing nitrogen more in the bottom layer than in the top layer is effective in preventing copper diffusion. The effects of increasing the N content include higher amorphous nature and prevention of copper diffusion due to segregation of nitrogen at the crystalline grain boundary. In general, metal nitrides tend to prevent copper diffusion. However, increasing the N content results in lower adhesion with copper, so it is effective to increase the Ru content in the layer where adhesion with copper is required. Also, resistivity can also be reduced by increasing the Ru content.

Forming the entire RuTaN film by means of $H_2/N_2$ plasma increases the N content, which is advantageous as a Cu diffusion barrier but reduces the adhesion with Cu at the same time. After examining which process would be effective in lowering the N content, the inventors found that changing the $H_2/N_2$ plasma to $H_2$ plasma after the supply of Ru precursor would significantly reduce the N content. Since the Ta material has Ta—N/Ta═N bonds to begin with, Ta—N is formed even by $H_2$ plasma. Surprisingly, however, implementing $H_2$ plasma after the supply of Ru material reduces N in Ta—N. To be specific, this reduction of N content requires two elements: one being adsorption of Ru material, and the other being $H_2$ plasma. Combination of the effects of these two elements breaks the Ta—N bond and reduces the N content (in other words, it is estimated that the Ta—N bond is broken down from the Ru material and the resulting decomposition product bonds with the N atom to be discharged; where, although this phenomenon is more likely to occur with Ru materials having a β-diketone structure, such estimation does not limit the present invention in any way). Also, plasma applied after the supply of Ta material can also be $H_2$ plasma, use of $H_2/N_2$ plasma is favorable because it has the effect of reducing carbon, which is an impurity, to a greater extent. Accordingly, in the case of a three-layer structure the following plasma combination can be used in an embodiment (in the case of a two-layer structure, the plasma condition is the same for the bottom layer and top layer). Here, the X cycle refers to a cycle where Ta atomic film deposition is repeated X times (Ta pulse), while the Y cycle refers to a cycle where Ru atomic film deposition is repeated Y times (Ru pulse).

TABLE 1

|  | X cycle | Y cycle |
| --- | --- | --- |
| Bottom layer | H2/N2 | H2/N2 |
| Intermediate layer | H2/N2 | H2/N2 (The $N_2$ ratio can be raised relative to the bottom layer.) |
| Top layer | H2/N2 | H2 |

Take note that the N content can be changed not only by implementing $H_2$ plasma after the supply of Ru material, but also by, for example, decreasing the Ru/Ta composition ratio in the intermediate layer, or specifically by increasing the Ta content and thereby increasing the N content comparably. This is because N easily bonds with Ta, among others.

If a three-layer structure is used as a barrier film, it is effective to provide three layers of bottom layer, intermediate layer and top layer, each offering a different function. To be specific, TaN is the most desirable material for the bottom layer because the insulation layer being a wiring inter-layer film needs to be formed in a manner maintaining good adhesion with the bottom-layer copper wiring and ensuring no separation. On the other hand, however, TaN is not suitable for adhesion with copper in the bottom layer. Ru provides the greatest adhesion property with respect to copper. Accordingly, forming a RuTaN layer in the bottom layer satisfies both requirements. In the meantime, the top layer only adheres to Cu wiring. Accordingly, Ru is the best choice for the top layer and adhesion will decrease if N is contained. If the top layer and bottom layer are to be designed by attaching importance to adhesion, it is effective to provide one more layer, or intermediate layer, to prevent diffusion of copper. Before, it was difficult to achieve both copper diffusion prevention property and adhesion at the same time. However, both can be achieved by forming an intermediate layer as an excellent copper diffusion barrier layer and then constituting the top layer and bottom layer by attaching importance to adhesion with copper. In an embodiment, these three layers can be formed by changing their compositions in a continuous process with ease. The intermediate layer need not contain Ru, and the top layer need not contain Ta. Even in this case, the resulting metal film is a continuously laminated atomic layer film and provides a Ru—Ta alloy as a whole.

Take note that a two-layer structure is also possible as long as copper diffusion barrier property, adhesion with copper and adhesion with the inter-layer insulation film can be ensured for the bottom layer film.

In an embodiment, $H_2/N_2$ plasma can be substituted by $NH_3$ plasma.

In the foregoing, Ru materials that allow for formation of a Ru atomic film by $H_2$ plasma applied after the supply of Ru material include those having the structure illustrated below:

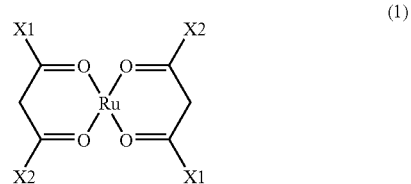

(1)

wherein X1 and X2 are each independently CH3, C(CH3)3, CH(CH3)2, or CH2(CH3).

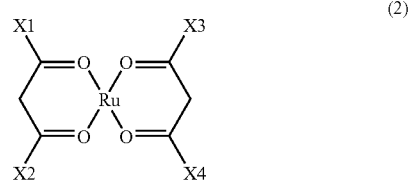

(2)

wherein X1 to X4 are each independently CH3, C(CH3)3, CH(CH3)2, or CH2(CH3), with a proviso that if X1 and X4 are the same, X2 and X3 are different.

In addition to the above, any Ru-containing compounds disclosed in U.S. patent application Ser. No. 11/469,828 and Ser. No. 11/557,891 and U.S. Provisional Application No. 60/976,378, all of which are owned by the same assignee as in the present application, can be used in embodiments (the disclosure of the Ru-containing precursor compounds taught in the above applications is herein incorporated by reference in their entirety).

If $Ru(EtCp)_2$ used in a published example is used, breaking it down requires $NH_3$ plasma or $H_2/N_2$ plasma and this increases the resistance of RuTaN. On the other hand, Ru materials having the aforementioned structure can be broken down by $H_2$ plasma, and even if $H_2/N_2$ plasma is used the resistance of the obtained RuTaN is lower than that of $Ru(EtCp)_2$.

In the case of a two-layer or three-layer structure, any of the film structures shown below can be used in an embodiment (the remainder is constituted by carbon atoms, etc.).

TABLE 2-1

<Two layers>

|  | Film thickness nm | Ru atoms % | Ta atoms % | Ru/Ta ratio | N atoms % |
|---|---|---|---|---|---|
| Bottom layer | 1 to 3 | 40 to 75 | 5 to 40 | 1 to 15 | 10 to 25 |
| Top layer | 1 to 3 | 75 to 99.9 | <5 | 15 to 100 | <5 |

TABLE 2-2

<Two layers>

|  | X | Y | Z | Y/X |
|---|---|---|---|---|
| Bottom layer | 1 | 1 to 3 | 10 to 100 | 1 to 3 |
| Top layer | 0 or 1 | 1 to 5 if X = 1 | 10 to 100 | 1 to 5 if X = 1 |

TABLE 3-1

<Three layers>

|  | Film thickness nm | Ru atoms % | Ta atoms % | Ru/Ta ratio | N atoms % |
|---|---|---|---|---|---|
| Bottom layer | 1 to 3 | 40 to 75 | 5 to 40 | 1 to 15 | 10 to 25 |
| Intermediate layer | 1 to 3 | <40 | >40 | <1 | 10 to 25 |
| Top layer | 0.5 to 3 | 75 to 99 | <5 | 15 to 100 | <5 |

TABLE 3-2

<Three layers>

|  | X | Y | Z | Y/X |
|---|---|---|---|---|
| Bottom layer | 1 | 1 to 3 | 10 to 100 | 1 to 3 |
| Intermediate layer | 1 | 0 or 1 | 10 to 100 | 0 to 1 |
| Top layer | 0 or 1 | 3 to 5 if X = 1 | 10 to 100 | 3 to 5 if X = 1 |

In an embodiment, Ru/RuTaN or RuTa/RuTaN can be formed continuously. Even in this case, the N content in the thickness direction of the film is controlled by applying $H_2/N_2$ plasma after the supply of Ta material and $H_2$ plasma or $H_2/N_2$ plasma after the supply of Ru material. The Ru content can be controlled in the top layer and wide-ranging films from Ru—Ta alloy film to Ru film can be formed. For example, form RuTaN, and then perform the Ta pulse once and Ru pulse 10 times, or perform the Ta pulse once and Ru pulse 10 times and repeat this twice or more, or perform the Ta pulse once and Ru pulse 20 times. Accordingly, in this embodiment, the following conditions are applied (regardless of the total number of layers in the film).

TABLE 3-3

|  | X | Y | Z | Y/X |
|---|---|---|---|---|
| Top layer | 0 or 1 | 5 to 30 if X = 1 | 1 to 10 | 5 to 30 if X = 1 |

In other embodiment, the number of Ta pulses (X) is controlled in a range of 1 to 5, while the number of Ru pulses (Y) is controlled in a range of 1 to 20.

Take note that, in yet other embodiment, the top layer and bottom layer conform to the following conditions regardless of the number of layers.

TABLE 4

|  | Ru atoms % | Ta atoms % | Ru/Ta ratio | N atoms % |
|---|---|---|---|---|
| Bottom layer | 20 to 75 | 5 to 70 | 1 to 15 | 10 to 25 |
| Top layer | 75 to 99 | <5 | 15 and up | <5 |

A pressure of 150 to 400 Pa and substrate temperature of approx. 250 to 300 degrees are sufficient as cycle conditions.

In the embodiment explained later using FIG. 1, the following conditions are used.

TABLE 5

| Step | X | Plasma (Ta) | Y | Plasma (Ru) |
|------|---|-------------|---|-------------|
| 1 | 1 | H2/N2 | 2 | H2/N2 |
| 2 | 1 | H2/N2 | 3 | H2 |

In the embodiment explained later using FIG. 2, the following conditions are used.

TABLE 6

| step | X | Plasma (Ta) | Y | Plasma (Ru) |
|------|---|-------------|---|-------------|
| 1 | 1 | H2/N2 | 2 | H2/N2 |
| 2 | 1 | H2/N2 | 1 | H2/N2 |
| 3 | 1 | H2/N2 | 3 | H2 |

In the embodiment explained later using FIG. 3, the following conditions are used.

TABLE 7

| step | X | Plasma (Ta) | Y | Plasma (Ru) |
|------|---|-------------|---|-------------|
| 1 | 1 | H2/N2 | 2 | H2/N2 |
| 2 | 1 | H2/N2 | 1 | H2/N2 |
| 3 | 1 | H2/N2 | 4 | H2 |

The intermediate layer can be divided into two to decrease the N content in the intermediate layer closer to the top layer, and increase the N content in the intermediate layer closer to the bottom layer, without changing the Ru/Ta ratio (thereby effectively providing a four-layer structure). For example, the following conditions can be used.

TABLE 8

| Step | X cycle | Plasma (Ta) | Y cycle | Plasma (Ru) |
|------|---------|-------------|---------|-------------|
| 1 | 1 | H2/N2 | 2 | H2/N2 |
| 2 | 1 | H2/N2 | 1 | H2/N2 |
| 3 | 1 | H2/N2 | 1 | H2 |
| 4 | 1 | H2/N2 | 3 | H2 |

Take note that in an embodiment, the metal film is constituted by a continuous layer formed by atomic layer deposition. This continuous layer is defined as a "layer" in a broader sense, while the aforementioned "top layer (top section)," "intermediate layer (intermediate section)" and "bottom layer (bottom section)" are defined as "layers" in a narrower sense than the aforementioned "layer" in a broader sense, in that they represent areas separated by the atomic layer deposition cycle condition or areas where the Ru, Ta and N composition is roughly uniform. Each layer deposited by atomic layer deposition is a "layer" in a narrower sense. Accordingly, in an embodiment, the "layer" in a broader sense has its Ru, Ta and N composition change in its thickness direction, but the Ru, Ta and N composition remains roughly unchanged in a more narrowly defined "layer" in its thickness direction. Also, in an embodiment, the top layer, bottom layer, intermediate layer, etc., can be defined simply by thickness (sometimes defining them by thickness is desirable, especially when the composition changes continuously in the thickness direction).

If the deposition condition is changed for each atomic layer, a layer defined by cycle condition is no longer identical with a layer defined by composition distribution. For example, a film can be grown by 0.2 to 0.5 angstrom in thickness in one atomic layer (narrower sense), and a normal atomic layer can be assumed as 2 angstrom. In this case, changing the condition for each cycle results in the formation of a narrowly defined layer in one cycle, and multiple sets of these narrowly defined layers are laminated. However, distinguishing the changes among individual layers is difficult, and if narrowly defined layers are defined by composition, then the entire structure becomes a single narrowly defined layer. For example, repeating X=1, Y=1 once and X=1, Y=2 once provides a film with an average composition of X=1, Y=1.5 and such film may appear to have only one layer. In this case, the "layer" that appears to be a single layer (based on composition analysis, etc.) is a narrowly defined layer. Accordingly, a narrowly defined layer, even when its composition changes continuously in the depth direction, should be treated as an area where the Ru, Ta and N composition is roughly uniform, as long as it appears to be a single layer.

For example, repeating X=1, Y=1 five times, repeating X=1, Y=2 and Y=1, Y=1 five times alternately, and then repeating X=1, Y=2 five times, may provide a film where only the Ru content has increased continuously, because the film thickness of each section is 2 to 3 angstrom. In this case, the obtained metal film is a "layer" in a broader sense constituted by a continuous layer formed by continuous atomic layer deposition, where the composition changes in the thickness direction of the layer. The bottom layer is a narrowly defined layer formed by repeating the initial condition of X=1, Y=1 five times, while the top layer is a narrowly defined layer formed by repeating the last condition of X=1, Y=2 five times. The intermediate layer is formed by repeating the two deposition cycle conditions five times alternately, so when this narrowly defined layer is defined by cycle condition, it is defined as being constituted by 10 "layers." However, the "intermediate layer" appears to have a roughly uniform composition, and thus it is treated as a single narrowly defined layer.

However, as explained above the cycle condition can be changed each time in the actual operation, and one cycle of atomic layer deposition is controlled proportionally to the thickness of atomic layer film (broader sense), or in a range of approx. 1/10 to 1/4, for example. Accordingly, it is possible in reality to implement finer control than in units of layers, and the composition can be made to look as if changing continuously. In this case, it is appropriate to separate narrowly defined layers by cycle condition.

In either case, the composition changes in a specified manner in a broadly defined "layer" in the thickness direction of the film. Also note that the above definitions apply only to an embodiment, and different definitions can be used in another embodiment (including definition by thickness, such as defining the top layer as a layer having a thickness of 1 to 3 nm from the top, bottom layer as a layer having a thickness of 1 to 3 nm from the bottom, and intermediate layer as a layer provided in an intermediate position having a thickness of 0.5 to 3 nm).

Next, an overview of a method for forming a RuTa alloy liner film conforming to an embodiment of the present invention is explained below. Take note, however, that the present invention is not limited to this embodiment in any way.

A basic method for forming a RuTa alloy is to, on wiring in the bottom layer, i) repeat X1 times a basic plasma atomic layer deposition cycle comprising a step to supply Ta material, step to purge gas, step to apply hydrogen/nitrogen plasma, and step to purge gas (this step can be omitted). Then, ii) repeat Y1 times a basic plasma atomic layer deposition cycle comprising a step to supply Ru material, step to purge gas, step to apply hydrogen plasma or hydrogen/nitrogen plasma or hydrogen plasma and nitrogen plasma continuously, and step to purge gas (this step can be omitted). Next, iii) repeat the aforementioned steps i) and ii) Z1 times to form the bottom layer of the RuTa alloy layer. Furthermore, i) repeat X2 times a basic plasma atomic layer deposition cycle comprising a step to supply Ta material, step to purge gas, step to apply hydrogen/nitrogen plasma, and step to purge gas (this step can be omitted), in a similar manner. Then, ii) repeat Y2 times a basic plasma atomic layer deposition cycle comprising a step to supply Ru material, step to purge gas, step to apply hydrogen plasma or hydrogen/nitrogen plasma or hydrogen plasma and nitrogen plasma continuously, and step to purge gas (this step can be omitted). Next, iii) repeat the aforementioned steps i) and ii) Z2 times to form on the bottom layer of the RuTa alloy layer a RuTa alloy having a different composition than the bottom layer. In addition, the values of X, Y and Z can be controlled continuously to form a RuTa layer having i layers after repetitions by Xi, Yi and Zi, in order to form a film whose composition changes in the thickness direction of the RuTa film.

Ta materials that can be applied to these processes proposed by the present invention include TAIMATA (Tertiaryamylimidotris(dimethylamido)tantalum), TBTDET (Ta(N-i-$C_4H_9$)[N($C_2H_5$)$_2$]$_3$), and PDMAT (Ta[N($CH_3$)$_2$]$_5$). Also, Ru materials include those coordinated by two or three β-diketones (X): Ru(CO)$_2$XY type materials coordinated by two carbonyl groups such as CpRuEt(CO)$_2$, CpRuMe(CO)$_2$ and (MeCp)RuMe(CO)$_2$; or Ru(CO)$_3$X type compounds coordinated by three carbonyl groups such as Ru(CO)$_3$$C_6H_7$($CH_3$), Ru(CO)$_3$(1-methyl-cyclopentadienyl), or Ru(CO)$_3$ (1-methyl-cyclohexadienyl). Also, it is expected that similar effects can also be achieved with Ru materials where one cyclopentadienyl (Cp) is coordinated to Ru and other different ligands are bonded.

As for the reactant gas to be applied following the supply of Ta material, use of mixed gas plasma of hydrogen and nitrogen results in lower resistivity compared to when hydrogen-only plasma is used. The reason is considered to be the promotion of dissociation of ligands, thereby causing carbon and other impurities to decrease. Accordingly, it is desirable to use mixed gas plasma of hydrogen and nitrogen after the supply of Ta material. On the other hand, it is possible to control the nitrogen content in a range of 0.1 to 10% if hydrogen plasma is used after the supply of any of the specific Ru materials mentioned above. If plasma of mixed gas of nitrogen and nitrogen is used, on the other hand, the nitrogen content can be controlled in a range of 10 to 25%.

In the first embodiment, the Cu wiring liner film is a Cu barrier metal film having a higher Ru content in the top layer than in the bottom layer, low Ru content in the bottom layer, high Ta content in the bottom layer, and low Ta content in the top layer. In the second embodiment, the Cu wiring liner film is a metal layer having a higher Ru content in the bottom layer than in the intermediate layer, low Ru content in the intermediate layer, higher Ru content in the top layer than in the intermediate layer, low Ta content in the bottom layer, high Ta content in the intermediate layer, and lower Ta content in the top layer than in the intermediate layer. In the third embodiment, the Cu wiring liner film is made by a process that achieves a high N content in the bottom layer and lower N content in the top layer than in the bottom layer. In the fourth embodiment, the Cu wiring liner film is made by a process that achieves a lower N content in the top layer than in the intermediate layer and bottom layer.

As for the method for forming a Cu wiring liner film in the first embodiment, the bottom layer is formed as a RuTaN layer using Ta material and $H_2/N_2$ plasma, and Ru material and $H_2/N_2$ plasma, where the number of Ru pulses is X relative to one Ta pulse. The top layer is formed as a RuTa layer using Ta material and $H_2/N_2$ plasma, and Ru material and $H_2$ plasma, where the number of Ru pulses is X or more relative to one Ta pulse. At this time, an appropriate value of X is normally around 1, 2 or 3. As for the method for forming a Cu wiring liner film in the second embodiment, on the other hand, a RuTaN layer is formed using Ta material and $H_2/N_2$ plasma, and Ru material and $H_2/N_2$ plasma, where the number of Ru pulses is X relative to one Ta pulse. The number of Ta pulse is 1 for the intermediate layer, while the number of Ru pulses is X or less for the bottom layer. With the top layer, on the other hand, X or more Ru pulses are performed for one Ta pulse. This way, the Ru content can be made high in the bottom layer, lower in the intermediate layer than in the bottom layer, and higher in the top layer than in the intermediate layer. Similarly, the Ta content can be made low in the bottom layer, higher in the intermediate layer than in the bottom layer, and higher in the top layer than in the intermediate layer. Normally, X is around 1 to 3. As for the method in the third embodiment, $H_2/N_2$ plasma is used for the bottom layer after the Ru material introduction step. For the top layer, however, $H_2$ plasma is used after the Ru material introduction step. In this $H_2$ plasma step, a RuTa alloy layer whose N content in the film is lowered to a controlled range of approx. 0.1 to 10% can be formed. As for the method for forming a Cu wiring liner film in the fourth embodiment, $H_2/N_2$ plasma is used for the bottom layer and intermediate layer after the introduction of Ru material, but $H_2$ plasma is used for the top layer. This way, the N content in the film is lowered to a range of 0.1 to 10%, while the N content in the RuTa alloy in the top layer becomes lower than in the intermediate layer and bottom layer. On the other hand, the nitrogen content is controlled to 10% or more in the intermediate layer and bottom layer.

As explained above, when forming a barrier having a specified composition in the depth direction, the composition ratio of Ru and Ta can be controlled by the number of pulses implemented during the atomic layer deposition of each material. In other words, the greater the value of X/Y, the higher the Ta content becomes compared to the Ru content when the Ta material introduction step and $H_2/N_2$ plasma step are repeated X times, and then the Ru material introduction step and $H_2/N_2$ plasma step or $H_2$ plasma step are repeated Y times. On the other hand, controlling the N content by applying $H_2$ plasma after the introduction of Ru material has the effect of reducing the N content. Accordingly, the N content can be controlled most efficiently in the plasma step after the supply of Ru material.

Favorable embodiments relate first and foremost to an optimal composition when an alloy of Ru and Ta, or Ru and Ti, is applied as a Cu barrier metal film. The following embodiments can be considered.

In the first embodiment, the Ru/Ta or Ru/Ti composition ratio changes in the thickness direction of the film, where the Ru content is higher in the top layer than in the bottom layer, and Ta or Ti content is lower in the bottom layer than in the top layer. This is because, although a barrier metal is normally formed on an inter-layer insulation film by the dual damascene method, higher Ta or Ti content works favorably in achieving good adhesion. On the other hand, a Cu wiring is formed in the top layer in the top section, which makes it desirable to have a higher Ru content in order to ensure good adhesion with Cu.

In the second embodiment, the Ru/Ta or Ru/Ti composition ratio changes in the thickness direction of the film, where the Ru content is lower in the intermediate layer than in the bottom layer, and higher in the top layer than in the intermediate layer. This is because the Cu layer is formed on a RuTa or RuTi alloy in the top layer, which makes it desirable to have a higher Ru content in order to ensure good adhesion. On the other hand, although the film is formed on a dual damascene inter-layer insulation film in the bottom layer, the via holes for connecting the bottom-layer wiring and top-layer wiring normally have Cu exposed in the bottom-layer Cu wiring area. To ensure adhesion between this Cu and barrier metal, the Ru content is desirably as high as permitted. On the other hand, the intermediate layer desirably has a structure most suited to prevent Cu diffusion, which is normally achieved as a Ta or Ti nitrided film. If an alloy containing Ru is used, the Ru content may be lower than in the top layer and bottom layer.

Under the method in the third embodiment, changing the N atomic composition in the depth direction also helps achieve effects similar to those mentioned above. With a RuTa alloy or RuTi alloy, increasing the nitrogen content in the bottom layer while decreasing it in the top layer is one effective embodiment. To be specific, increasing the nitrogen content improves the function as a Cu diffusion barrier. When adhesion with the Cu wiring in the top layer is considered, on the other hand, a lower N content in the top layer results in greater adhesion. In a different embodiment, it is also effective to lower the nitrogen content in the bottom layer, raise it in the intermediate layer, and lower it in the top layer for a RuTa alloy or RuTi alloy. This is because dual damascene via holes have Cu exposed in the bottom-layer wiring area, and adhesion with this Cu can be improved by lowering the N content to a level not causing the adhesion to drop. On the other hand, good Cu diffusion barrier property can be ensured by relatively increasing the N content in the intermediate layer, while adhesion with the Cu wiring in the top layer can be enhanced by lowering the N content in the top layer.

In connection with the method for controlling the composition of such RuTa and RuTi alloys, the inventors examined ways to continuously change the composition in the depth direction of the film. As a result, it was found that the Ru, Ta and N composition, or Ru, Ti and N composition, can be changed in the depth direction by using the plasma atomic layer deposition method. This finding led to the establishment of a method for forming a RuTa alloy or RuTi alloy having varying compositions by selecting specific Ta and Ru materials that allow for implementation of a thin film forming process at the same temperature using the same vacuum apparatus. This method comprises a first process where a step to supply material vapor constituted by Ta atoms and another step to supply a first reactant gas obtained by high-frequency excitation of a reactant gas containing at least hydrogen gas are repeated at least X times, as well as a second process where a step to supply material vapor constituted by Ru atoms and another step to supply a first reactant gas obtained by high-frequency excitation of a reactant gas containing at least hydrogen gas are repeated at least Y times, and a metal film manufacturing process where the aforementioned first process and second process are repeated multiple times (Z times) is repeated to form a film. In other words, the characteristics of the process for forming a RuTa alloy having a specific composition can be expressed as (X, Y, Z). By changing the values of (X, Y, Z), such as repeating the process N times from (X0, Y0, Z0), (X1, Y1, Z1), to (Xn, Yn, Zn), the value of X/Y in each cycle can be changed to change the Ru/Ta composition ratio in the depth direction, while the value of Z can be changed to change the film thickness. Accordingly, the Ru content can be increased on the Cu wiring side and decreased on the insulation film side in order to improve the adhesion with Cu, and similarly the Ta content can be decreased on the Cu wiring side and increased on the insulation film side.

In the case of a Cu diffusion barrier film constituted by a RuTa alloy or RuTi alloy, nitriding tends to improve the barrier property and controls the profile of nitrogen in such film in the depth direction. There is a first process where a step to supply material vapor constituted by Ta atoms and another step to supply a first reactant gas obtained by high-frequency excitation of a reactant gas containing at least hydrogen gas are repeated at least X times, and there is also a second process where a step to supply material vapor constituted by Ru atoms and another step to supply a first reactant gas obtained by high-frequency excitation of a reactant gas containing at least hydrogen gas are repeated at least Y times, and a metal film manufacturing process where the aforementioned first process and second process are repeated multiple times (Z times) is repeated to form a film. Although plasma by hydrogen gas or hydrogen/nitrogen mixed gas is used after the supply of Ta material, and plasma by hydrogen gas or hydrogen/nitrogen mixed gas is used after the supply of Ru material, the nitrogen content can be controlled independently of the Ru/Ta composition ratio by introducing plasma of hydrogen/nitrogen mixed gas after the supply of Ru material or controlling the flow rate of nitrogen relative to the flow rate of hydrogen. Accordingly, the inventors confirmed that even when (X, Y, Z) are the same, the nitrogen content can be increased by introducing nitrogen gas or increasing the amount of nitrogen in the plasma step following the supply of Ru material. Therefore, under this characteristic process (X, Y(N), Z) represent introduction of nitrogen gas by means of plasma after the supply of Ru material, while (X, Y(H), Z) represent hydrogen plasma after the supply of Ru material. Under these definitions, the nitrogen content changes significantly between Y(H) and Y(N) even when X/Y and Z are the same. Accordingly, N atoms can be changed in the depth direction by changing X/Y or adjusting Y as Y(N) in the (X, Y(N), Z) process, just like when changing the Ru/Ta composition ratio in the depth direction according to the X/Y ratio. Increase in the nitrogen content tends to reduce the adhesion with Cu wiring, and thus the N content can be decreased on the Cu wiring side and increased in the film or on the insulation film side. Also, breakdown of Ta material is promoted more when hydrogen/nitrogen plasma is used, compared to when hydrogen plasma is used, after the supply of Ta material, and therefore hydrogen/nitrogen plasma is desirably used. On the other hand, the N content of RuTa alloy or RuTi alloy is affected more by whether or not nitrogen gas is introduced in the plasma step using reducing gas after the supply of Ru material.

Next, in a different embodiment, the control of N content in the depth direction can be achieved simultaneously with the control of Ru/Ta or Ru/Ti composition in the depth direction. In this case, whether to mainly use hydrogen plasma using reducing gas or hydrogen/nitrogen mixed gas after the supply of Ru material, simultaneously as the X/Y ratio control, has significant impact. Accordingly, the Ru/Ta composition and nitrogen content in the depth direction can be controlled by changing X/Y and whether or not mainly Y is adjusted to Y(N), respectively.

Optimal Ta materials in the above process include TAIMATA (Tertiaryamylimidotris(dimethylamido)tantalum), TBTDET (Ta(N-i-$C_4H_9$)[N($C_2H_5$)$_2$]$_3$), and PDMAT (Ta[N($CH_3$)$_2$]$_5$), because selecting at least one type in the aforementioned group was found favorable in implementing the present invention. Particularly in the formation of a RuTa alloy using any of these materials, use of plasma of hydrogen/nitrogen mixed gas in the plasma step after the supply of Ta material was effective in reducing the film resistivity and increasing the film density compared to when hydrogen-only plasma was used. This is because mixed gas plasma better promotes dissociation of ligands in Ta material.

Take note that in the above process, optimal Ru materials were found to be those coordinated by a β-diketone group or groups or others coordinated by a carbonyl group or groups. These materials are adsorbed to an insulation film relatively easily, which makes them effective materials in the atomic layer deposition process. These materials also exhibit a stronger tendency of ligand dissociation when a reducing gas is applied. Furthermore, among Ru materials those molecules having one pentadienyl group are relatively easy to break down and thus easily adsorbed to an insulation film, and the adsorbed material also breaks down easily when a reducing gas is applied. Based on the above, these Ru materials were found favorable in the formation of a RuTa alloy. In particular, materials coordinated by a β-diketone group or groups were broken down favorably even with hydrogen plasma, and similar breakdown property was obtained when mixed gas of hydrogen and nitrogen was used. Other Ru materials were also found to break down in hydrogen in general, although the degree of reactivity to hydrogen was different.

Accordingly, a RuTa alloy or RuTi alloy formed by utilizing any of these forming methods and materials confirming to the present invention provides favorable characteristics as a next-generation Cu barrier metal and is extremely effective in the formation of next-generation semiconductor elements.

The aforementioned characteristics in embodiments of the present invention are explained by referring to the drawings of favorable embodiments.

In the present disclosure where conditions and/or structures are not specified, the skilled artisan in the art can readily provide such conditions and/or structures, in view of the present disclosure, as a matter of routine experimentation.

FIGS. 1, 2 and 3 show profiles of Ru, Ta and N compositions in the depth direction of RuTa alloys obtained in embodiments of the present invention. The table in FIG. 1 shows this atomic layer deposition process. Here, X indicates the number of Ta material pulses, Y indicates the number of Ru material pulses, Plasma(Ta) indicates the gas used in the plasma step after the supply of Ta material, and Plasma(Ru) indicates the gas used in the plasma step after the supply of Ru material. In the first RuTa alloy layer deposition cycle, X=1, Y=2, Plasma(Ta): $H_2/N_2$ and Plasma(Ru): $H_2/N_2$ are used. In this case, the atomic composition is such that Ru accounts for 60%, Ta accounts for approx. 15%, and N accounts for approx. 15%. These percentages change slightly according to the combination of Ta and Ru materials. This cycle is repeated for a specified number of times, and then a Ru/Ta alloy in the top layer is formed. Here, X=1, Y=3, Plasma(Ta): $H_2/N_2$ and Plasma(Ru): $H_2$ are used. In this case, the Ru content is in a range of 70 to 80%, while the Ta content is in a range of 3 to 5%. FIG. 1 shows the composition distribution obtained by this process for forming a RuTa alloy constituted by the aforementioned mutually continuous two layers. In the bottom layer, the Ru/Ta ratio is approx. 4, while the N content is approx. 15%. In the top layer, on the other hand, the Ru/Ta ratio is approx. 15 to 20, while the N content is 5% or less, indicating a Ru-rich film. Accordingly, the top layer film has good adhesion with the Cu film.

FIG. 2 shows a distribution of compositions in the depth direction of a Cu barrier metal film obtained in an embodiment. The table in FIG. 2 shows this atomic layer deposition process. Here, X indicates the number of Ta material pulses, Y indicates the number of Ru material pulses, Plasma(Ta) indicates the gas used in the plasma step after the supply of Ta material, and Plasma(Ru) indicates the gas used in the plasma step after the supply of Ru material. In the first RuTa alloy layer deposition cycle, X=1, Y=2, Plasma(Ta): $H_2/N_2$ and Plasma(Ru): $H_2/N_2$ are used. This cycle is repeated for a specified number of times, and then a Ru/Ta alloy in the top layer is formed. In this case, the Ru content is 60%, Ta content is approx. 15%, and N content is approx. 15%. Here, X=1, Y=2, Plasma(Ta): $H_2/N_2$ and Plasma(Ru): $H_2/N_2$ are use In this case, although the N content is 15 to 20%, the Ru content is 40 to 50%, while the Ta content is approx. 30 to 40%. Furthermore, for the third layer X=1, Y=3, Plasma(Ta): $H_2/N_2$ and Plasma(Ru): $H_2$ are used. In this case, the Ru content is in a range of 70 to 80%, while the Ta content is in a range of 3 to 5%. FIG. 2 shows the composition distribution obtained by this process for forming a RuTa alloy constituted by the aforementioned mutually continuous two layers. In the bottom layer, the Ru/Ta ratio is approx. 4, while the N content is approx. 15%. In the intermediate layer, on the other hand, the Ru/Ta ratio is approx. 1 to 1.5, while the N content is approx. 15 to 20%. In the top layer, the Ru/Ta ratio is approx. 15 to 20, while the N content is 5% or less, indicating a Ru-rich film. Accordingly, the top layer is Ru-rich and low on N content, thereby achieving good adhesion with Cu. In the meantime, the Ru/Ta composition ratio drops and the N content increases in the intermediate layer of the film, which contributes to good Cu barrier property. Furthermore, the bottom layer is Ru-rich, but the N content is also high, which suggests that the adhesion with Cu in the bottom layer is also expected to be favorable despite the film being a Cu barrier film.

FIG. 3 shows a distribution of compositions in the depth direction of a Cu barrier metal film obtained in an embodiment. The table in FIG. 3 shows this atomic layer deposition process. Here, X indicates the number of Ta material pulses, Y indicates the number of Ru material pulses, Plasma(Ta) indicates the gas used in the plasma step after the supply of Ta material, and Plasma(Ru) indicates the gas used in the plasma step after the supply of Ru material. In the first RuTa alloy layer deposition cycle, X=1, Y=2, Plasma(Ta): $H_2/N_2$ and Plasma(Ru): $H_2/N_2$ are used. This cycle is repeated for a specified number of times, and then a Ru/Ta alloy in the bottom layer is formed. Here, X=1, Y=2, Plasma(Ta): $H_2/N_2$ and Plasma(Ru): $H_2/N_2$ are used. FIG. 2 shows the distribution of compositions obtained by the process for forming a RuTa alloy constituted by these mutually continuous two layers. Furthermore, an intermediate layer is formed based on X=1, Y=1, Plasma(Ta): $H_2/N_2$ and Plasma(Ru): $H_2/N_2$. In addition, a Ru film is formed in the top layer based on X=1 and Y=5. Accordingly, the Ru content is increased in the bottom layer to improve the adhesion with the Cu layer. On the other hand, the Ta content is increased and N content is controlled in the intermediate layer to ensure good Cu barrier property. Furthermore, a Ru film is formed in the top layer and a Cu film is formed on top of this Ru.

The Ru/Ta composition of this Cu barrier metal can be changed continuously in the same vacuum process. The residual carbon content drops due to hydrogen/nitrogen plasma after the supply of Ta material, and also the N content can be decreased or controlled using hydrogen plasma after the supply of Ru material.

Figure 4:
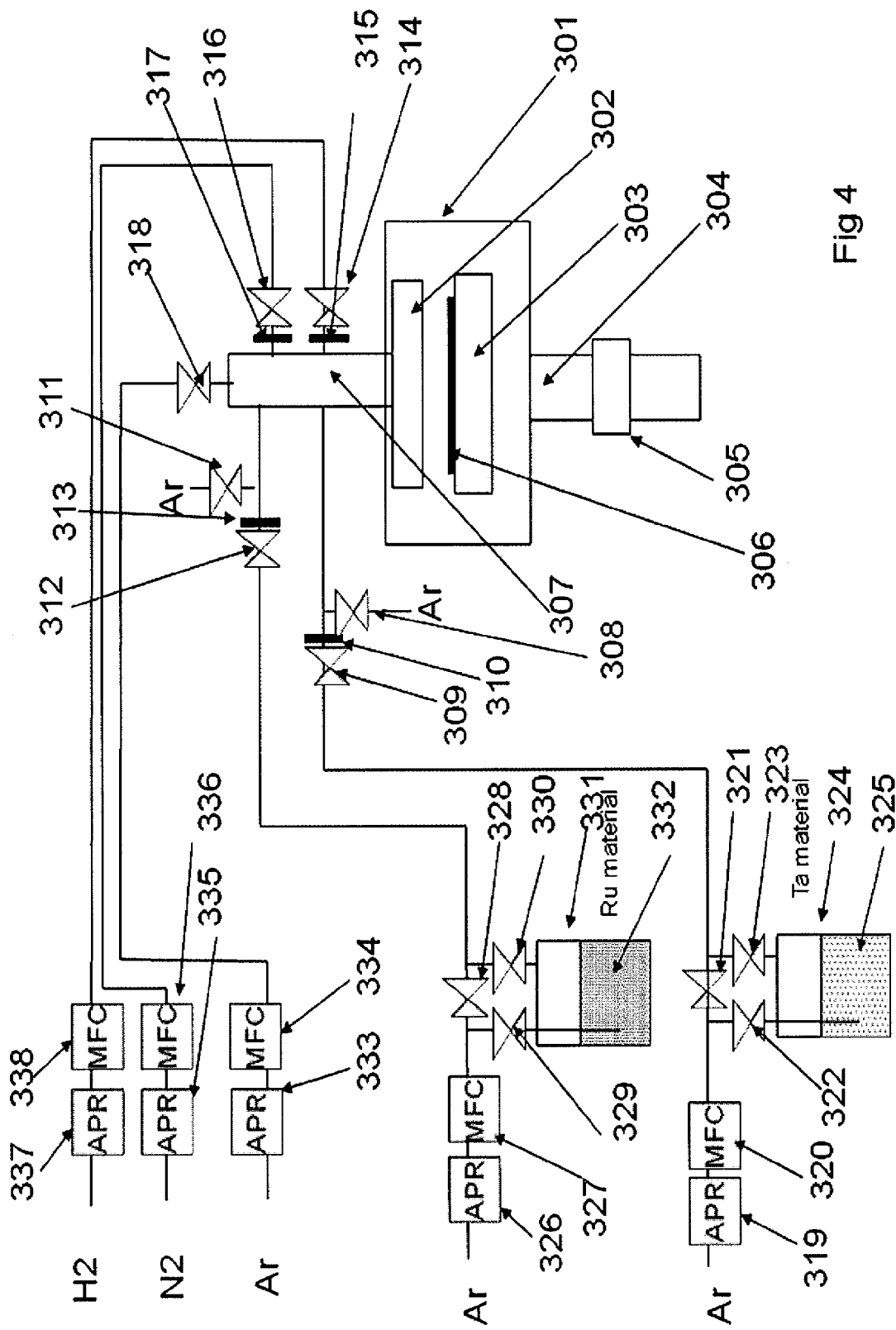
FIG. 4 is a schematic structural diagram showing one example of an atomic layer deposition apparatus that can be used in the film forming process in an embodiment of the present invention.
Figure 5:
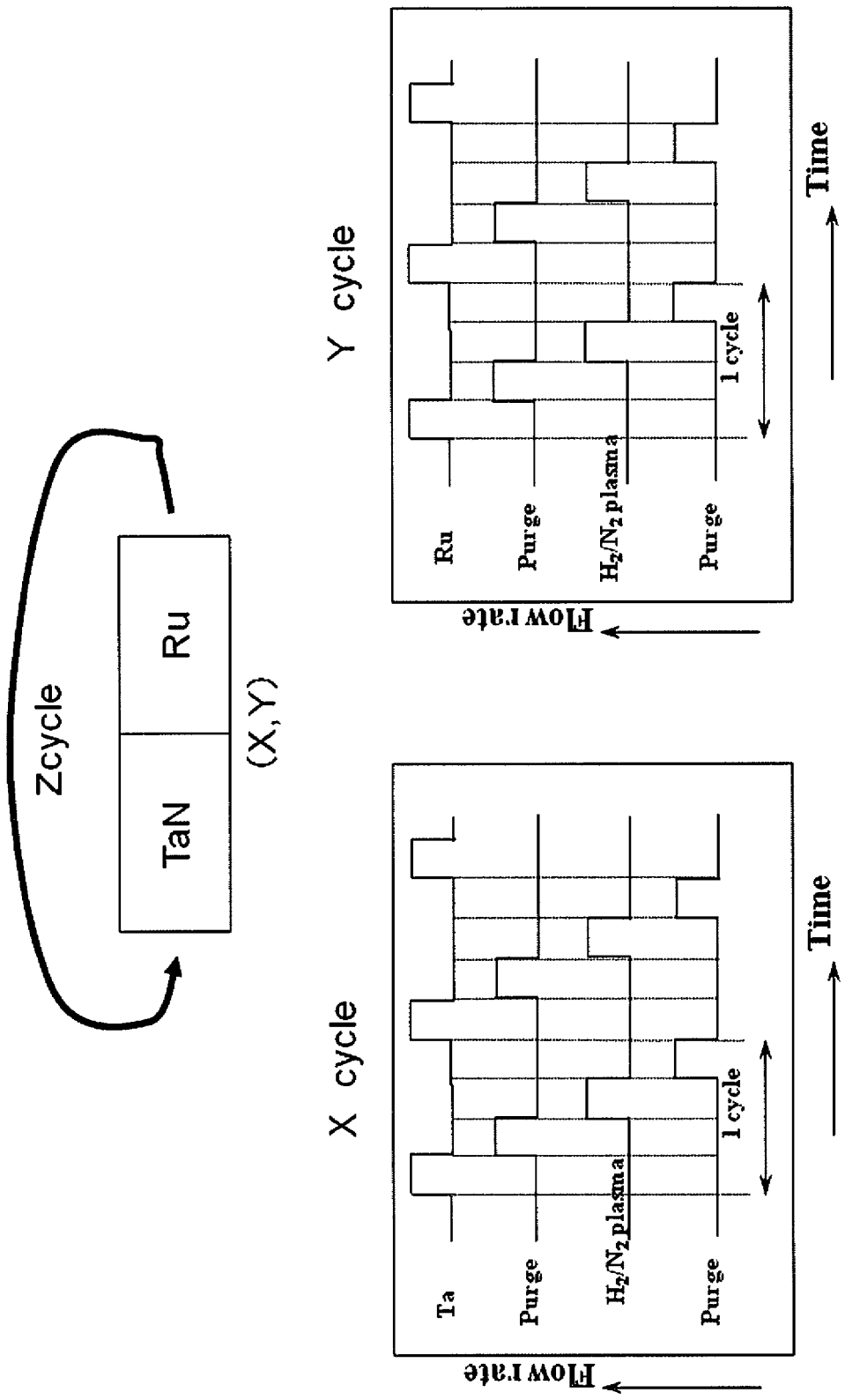
FIG. 5 is a schematic diagram showing an atomic layer deposition process sequence for forming a RuTa alloy in an embodiment of the present invention.

FIG. 4 shows a process apparatus for RuTa alloy used to form a Cu barrier metal film explained in any one of FIGS. 1 to 3. FIG. 5 illustrates a detailed process implemented by this apparatus. FIG. 4 is used to illustrate the structure of a basic plasma atomic layer deposition apparatus for forming RuTa alloy. This apparatus comprises a reaction apparatus 301 housing a substrate heating base 303, an exhaust 304, a showerhead 302, a gas introduction pipe connected to showerhead 307, a substrate 306, an exhaust pipe 304 and a pressure regulating valve 305. The gas introduction system comprises a Ta material supply system, a Ru material supply system, a $H_2$ gas supply system, a $N_2$ gas supply system and an Ar gas supply system. First, the structure of the Ta material supply system is explained using FIG. 4. Numeral 319 indicates an APR (auto pressure regulator), which controls the secondary pressure to a specified level. Numeral 320 indicates a MFC (mass flow controller), which controls the flow rate to a specified level. Ta material is denoted by 325, and filled in a material tank 324. The Ta material supply system has an Ar gas introduction valve 322, a bypass valve 321 and a material supply valve 323. Numeral 309 indicates a Ta material introduction valve, numeral 310 indicates an orifice, and numeral 308 indicates an argon gas introduction valve for dilution or purge. Argon gas supplied at a specified pressure is used to transport material vapor pressure in the material tank 324, and when the valve 309 is opened the material is fed through the specified gas introduction hole in the orifice to the gas introduction pipe 307 at a flow rate according to the pressure set by the APR 319. Next, Ru material supply is explained in a similar manner. Numeral 326 indicates an APR (auto pressure regulator), which controls the secondary pressure to a specified level. Numeral 327 indicates a MFC (mass flow controller), which controls the flow rate to a specified level. Ru material is denoted by 332, and filled in a material tank 331. The Ru material supply system has an Ar gas introduction valve 329, a bypass valve 328 and a material supply valve 330. Numeral 312 indicates a Ru material introduction valve, numeral 313 indicates an orifice, and numeral 311 indicates an argon gas introduction valve for dilution or purge. Argon gas supplied at a specified pressure is used to transport material vapor pressure in the material tank 331, and when the valve 312 is opened the material is fed through the specified gas introduction hole in the orifice 313 to the gas introduction pipe 307 at a flow rate according to the pressure set by the APR 326. In the aforementioned Ta material supply and Ru material supply, the MFCs 320, 327 are not controlled during the process, but they are used only to monitor the flow rate with the valves in the MFCs remaining open.

Next, the $H_2$, $N_2$ and Ar gas supply systems are explained using FIG. 4. As for the gases supplied via pulsation for use in the plasma atomic layer deposition process, APRs (auto pressure regulators) 333, 335, 337 and MFCs (mass flow controllers) 334, 336, 338 are connected in series, just like in the case of the Ta material supply system and Ru material supply system, and the respective units are connected to gas introduction valves 314, 316, 318. The hydrogen and nitrogen lines have orifices 315, 317 and introduction holes are provided to allow a specified flow rate to be achieved over a short period. Although not illustrated, it is effective to install an orifice in the introduction valve 318 if gas is to be introduced at a specified flow rate over a short period. Similar effects can be achieved using an atomic layer deposition apparatus not having the aforementioned apparatus structure or gas system structures, as long as the apparatus is designed to achieve a similar purpose.

FIG. 5 shows the details of the plasma atomic layer deposition process for implementing the processes shown in FIGS. 1 to 3 using the apparatus illustrated in FIG. 4 above. FIG. 5 shows a sequence comprising a TaN, TaNC film forming process by plasma atomic layer deposition using Ta material where such process comprises a Ta material supply step, purge step, plasma step using $H_2/N_2$ mixed gas and purge step, as well as a Ru film forming process by plasma atomic layer deposition using Ru material where such process comprises a Ru material supply step, purge step, plasma step using $H_2/N_2$ mixed gas and purge step. Here, if a RuTa alloy is formed, the plasma atomic layer deposition process using Ta material is implemented X times, and then the plasma atomic layer deposition process using Ru material is implemented Y times, and the foregoing is repeated Z times to form a RuTa alloy having a desired Ta/Ru composition. Here, the deposition speed of TaN or TaNC is approx. 2.5 times the deposition speed of Ru, and thus normally X is adjusted to 1, while Y is adjusted to around 1 to 10, or desirably around 1 to 5, to repeat X and Y Z times to form a RuTa alloy. It is also possible, after the process repetition of Z times, to change the values of X and Y to X1 and Y1 and repeat X and Y Z1 times further, in order to laminate the second RuTa alloy layer on top of the first RuTa alloy layer. Furthermore, the foregoing can be repeated to control the Ru/Ta composition in the depth direction of the film.

Figure 6:
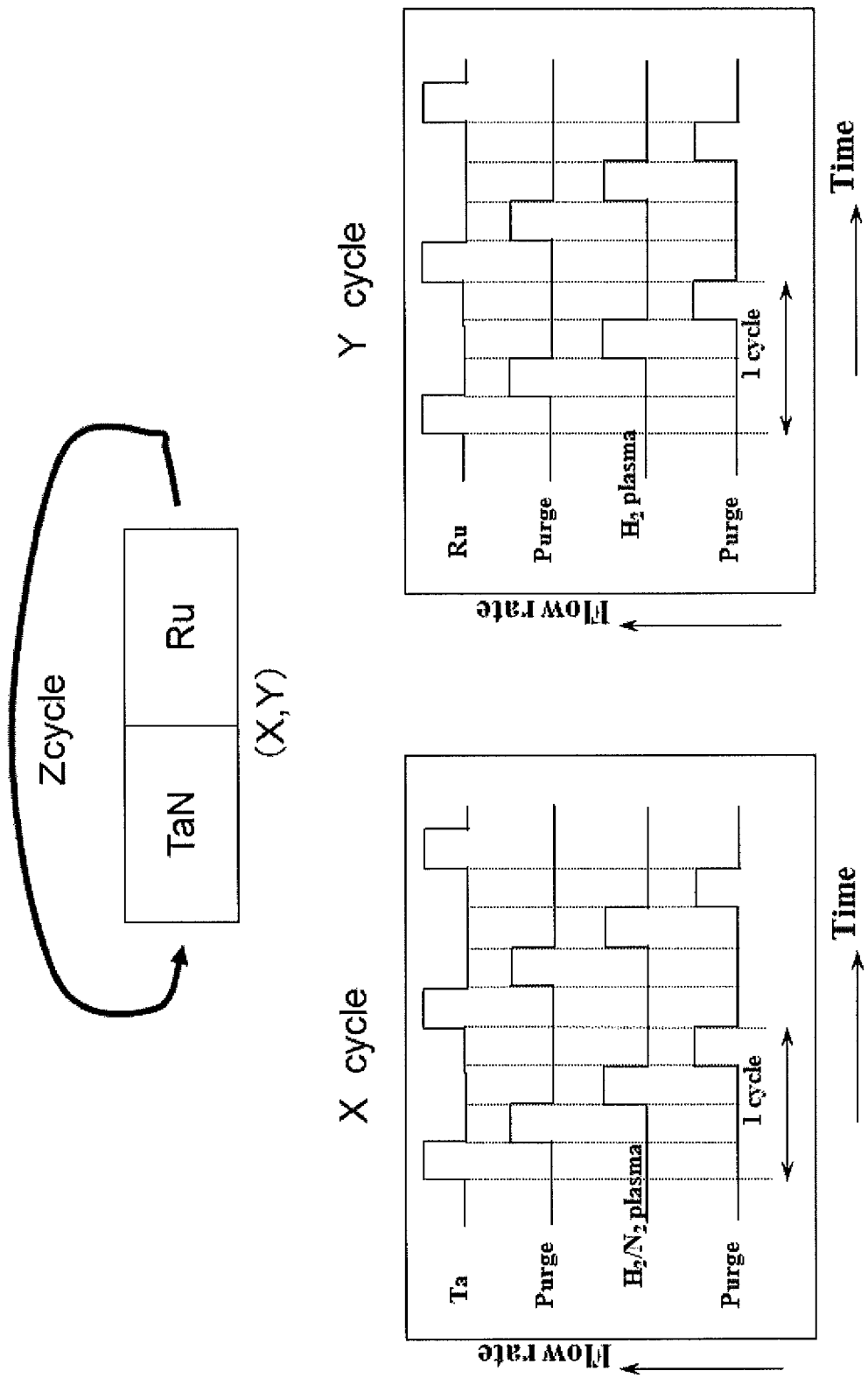
FIG. 6 is a schematic diagram showing an atomic layer deposition process sequence for forming a RuTa alloy in an embodiment of the present invention.

FIG. 6 shows what happens when a plasma step by $H_2$ gas is used as the plasma step after the Ru material supply step and purge step. In this case, the N content in the RuTa alloy drops. Accordingly, it is possible to control the N content in the film by combining the method illustrated in FIG. 5 with the method illustrated in FIG. 6. FIG. 7 shows a process where the RuTa barrier metal film having the composition shown in FIG. 2 is applied to a normal Cu wiring forming process based on dual damascene.

In FIG. 7(a), a SiCN 102 being a Cu barrier insulation film, an inter-layer insulation film 103, an etching stop film 104, an inter-layer insulation film 105 and an etching stop film 106 are formed on a Cu wiring 101 in the bottom layer, to form a dual damascene wiring structure. Here, numeral 107 indicates a via hole, while numeral 108 indicates a wiring area. In FIGS. 7(b) and (c), application of the process in FIG. 1 is shown. In FIG. 7(b), numeral 113 indicates the process of Step 1 shown in Table 1 in FIG. 1, where X=1, Y=2, $H_2/N_2$ is used as plasma, and a RuTaN film whose nitrogen content is relatively high is formed. On the other hand, numeral 114 in FIG. 7(c) indicates the process of Step 2 shown in Table 1 in FIG. 1, where X=1, Y=3, $H_2/N_2$ mixed gas is used as plasma after the supply of Ta material, and $H_2$ is used as plasma after the supply of Ru material. In this case, the film contains Ru by 6 to 7 times the content of Ta and the N content is low. In FIG. 7(d), numeral 115 indicates a Cu film formed by the PVD method. This film can also be formed as a Cu film by the CVD method. In FIG. 7(e), numeral 116 indicates a Cu film formed by electroplating, while FIG. 7(f) shows a Cu wiring 118 obtained after the CMP process.

FIG. 8 shows the application of a Cu barrier metal film having the composition shown in FIG. 2 to a dual damascene Cu wiring using the process shown in Table 2. In FIG. 8(a), a SiCN 102 being a Cu barrier insulation film, an inter-layer insulation film 103, an etching stop film 104, an inter-layer insulation film 105 and an etching stop film 106 are formed on a Cu wiring 101 in the bottom layer, to form a dual damascene wiring structure. Here, numeral 107 indicates a via hole, while numeral 108 indicates a wiring area. In FIGS. 8(b) to (d), application of the process in FIG. 2 is shown. In FIG. 8(b), numeral 413 indicates the process of Step 1 shown in Table 2 in FIG. 2, where X=1, Y=2, $H_2/N_2$ is used as plasma, and a RuTaN film whose nitrogen content is relatively high is formed. On the other hand, numeral 414 in FIG. 8(c) indicates the process of Step 2 shown in Table 2 in FIG. 2, where X=1, Y=1, $H_2/N_2$ mixed gas is used as plasma after the supply of Ta material, and $H_2/N_2$ mixed gas is used as plasma after the supply of Ru material. In this case, a RuTa alloy whose Ru content is lower than in the first layer is formed. In FIG. 8(d), a RuTa alloy 415 conforming to Step 3 shown in Table 2 in FIG. 2 is formed as the third layer. Here, X=1, Y=3, and hydrogen plasma is used after the supply of Ru material. Accordingly, a film containing Ru by 6 to 7 times the content of Ta and whose N content is low can be formed. In FIG. 8(e), numeral 416 indicates a Cu film formed by the PVD method. This film can also be formed as a Cu film by the CVD method. In FIG. 8(f), numeral 417 indicates a Cu film formed by electroplating, while FIG. 8(g) shows a Cu wiring 418 obtained after the CMP process.

FIG. 9 shows the application of a Cu barrier metal film having the composition shown in FIG. 3 to a dual damascene Cu wiring using the process shown in Table 3. In FIG. 9(a), a SiCN 102 being a Cu barrier insulation film, an inter-layer insulation film 103, an etching stop film 104, an inter-layer insulation film 105 and an etching stop film 106 are formed on a Cu wiring 101 in the bottom layer, to form a dual damascene wiring structure. Here, numeral 107 indicates a via hole, while numeral 108 indicates a wiring area. In FIGS. 9(b) to (d), application of the process in FIG. 3 is shown. In FIG. 9(b), numeral 413 indicates the process of Step 1 shown in Table 3 in FIG. 3, where X=1, Y=2, $H_2/N_2$ is used as plasma, and a RuTaN film whose nitrogen content is relatively high is formed. On the other hand, numeral 414 in FIG. 9(c) indicates the process of Step 2 shown in Table 2 in FIG. 2, where X=1, Y=1, H$_2$/N$_2$ mixed gas is used as plasma after the supply of Ta material, and H$_2$/N$_2$ mixed gas is used as plasma after the supply of Ru material. In this case, a RuTa alloy whose Ru content is lower than in the first layer is formed. In FIG. 9(d), Ru 419 conforming to Step 3 shown in Table 3 in FIG. 3 is formed as the third layer. Here, X=1, Y=5, and hydrogen plasma is used after the supply of Ru material. Accordingly, a film whose Ru content is 90% or more and N content is low can be formed. In FIG. 9(e), numeral 416 indicates a Cu film formed by the PVD method. This film can also be formed as a Cu film by the CVD method. In FIG. 9(f), numeral 417 indicates a Cu film formed by electroplating, while FIG. 9(g) shows a Cu wiring 420 obtained after the CMP process.

As explained above, the present invention is characterized by formation of films having the compositions shown in FIGS. 1 to 3 by combining the basic sequences of basic plasma atomic layer deposition shown in FIGS. 5 and 6 using the apparatus shown in FIG. 4, and the actual application of the present invention to semiconductor elements is achieved according to the process procedures shown in FIGS. 7 to 9. The examples cited here only talk about changing the Ru, Ta and N composition, from those shown in FIGS. 1 to 3, in the thickness direction of the film. However, the present invention is not at all limited to these specific examples and its object is basically to obtain a RuTa film having a desired composition distribution by combining the processes in FIGS. 5 and 6 in a desired manner. This object can also be achieved with a RuTi alloy in a similar fashion.

Specific examples are explained in further detail using the aforementioned drawings. Take note, however, that these examples are not intended to limit the present invention in any way and are designed to clearly show the effects of methods conforming to the present invention by illustrating specific examples.

Example 1

A specific example where the process in FIG. 1 is implemented using the apparatus shown in FIG. 4 based on the process sequences shown in FIGS. 5 and 6 is explained.

Figure 10:
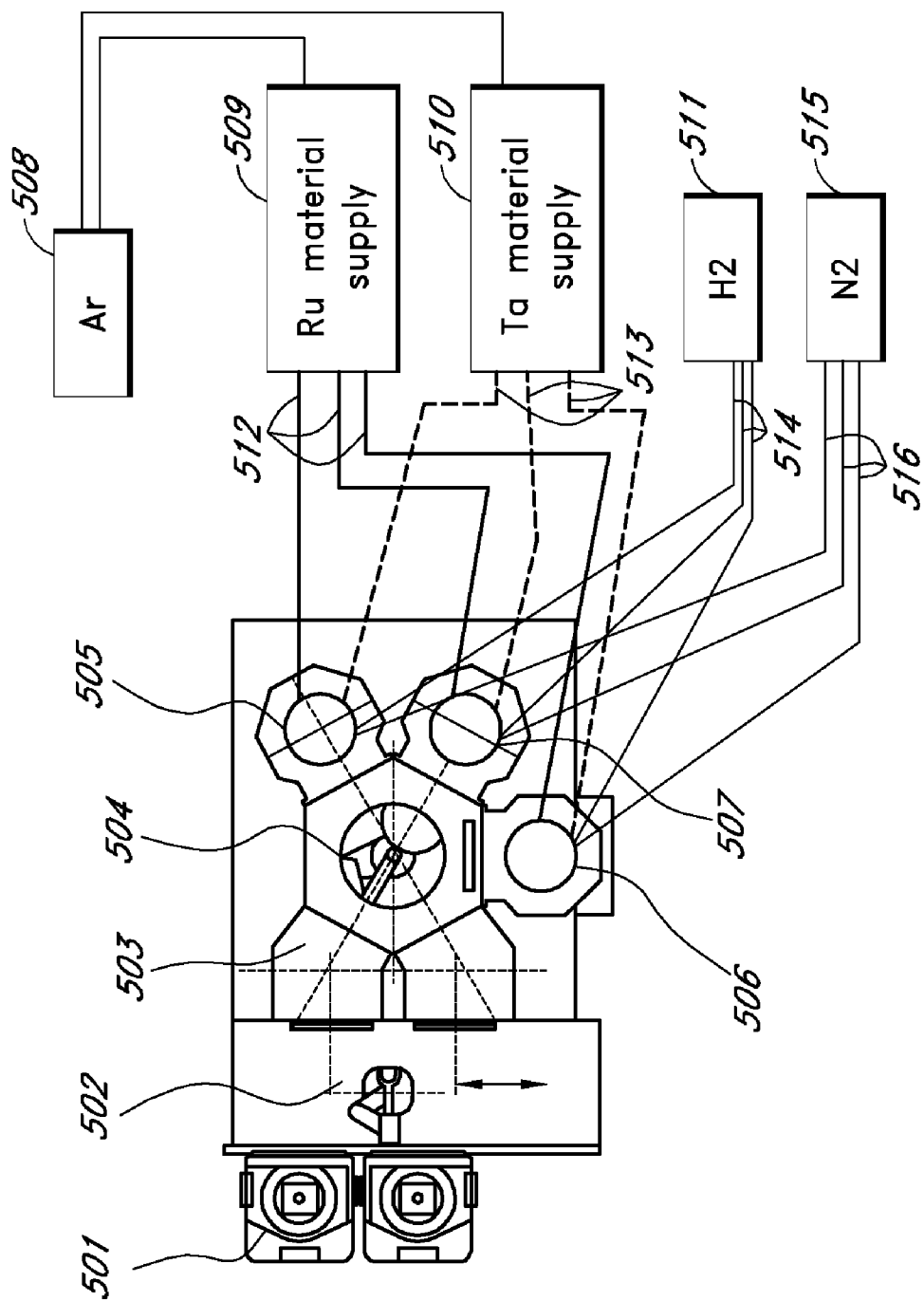
FIG. 10 is a schematic structural diagram showing one example of an atomic layer deposition apparatus that can be used in the film forming process in an embodiment of the present invention.

A Cu wiring is formed according to the process shown in FIG. 7 in a Cu wiring forming process based on dual damascene structure. Silicon substrates having a device that has been processed up to the state in FIG. 7(a) are treated using the apparatus shown in FIG. 10. A silicon substrate is set in a cassette loader 501, and a transfer robot 502 is used to transfer the substrate into a load lock chamber 503, after which the substrate is transferred by a vacuum robot 504 from the load lock chamber 503 into a reaction chamber for plasma atomic layer deposition 505. The next substrate is transferred to a reaction chamber 507, and the subsequent substrate is transferred to a reaction chamber 508, to allow the process to be implemented in a similar manner. The substrate transferred to the reaction chamber 505 is placed on the substrate heating base that has been set to a specified temperature. The reaction chambers 505, 506, 507 have an Ar gas supply 508, a Ru material supply 509 and a Ta gas supply 510, respectively. Furthermore, a hydrogen gas supply 511 and a nitrogen gas supply 515 are also installed. Accordingly, the same process sequence can be implemented in any reactor.

Here, TAIMATA is used as the Ta material, while CpRu(CO)$_2$Et is used as the Ru material. The process was implemented by adjusting the substrate temperature to a range of 250 to 300 degrees, or preferably to 280 degrees. TAIMATA was heated to 90 degrees, and the Ta material was supplied by means of argon gas, while the Ru material was heated to 35 degrees and supplied by means of argon gas. The supply pressures of Ta and Ru materials were optimized in a range of 150 to 400 Pa, while the process pressures during plasma generation were also optimized in a range of 150 to 400 Pa.

As for the implementation of the process in FIG. 1, Step 1 uses the sequence shown in FIG. 5, while Step 2 uses the sequence shown in FIG. 6, and based on the structural diagram of the apparatus in FIG. 4 the gas control in the actual process is implemented according to the valve operations and gas flow rates shown in Table 9 for Step 1, and those shown in Table 10 for Step 2. Here, the Ru supply cycle is repeated twice in Step 1, and three times in Step 2, relative to one cycle of Ta material supply, purge, plasma step and purge, in order to control the Ta/Ru composition. The gas flow rates shown in Tables 9 and 10 are representative values, and needless to say these flow rates will change according to the process apparatus, process conditions, etc. A RuTa barrier metal film having the composition shown in FIG. 1 can be formed using the process apparatus shown in FIG. 4 based on the specific process conditions shown in Tables 9 and 10. In this example, the film thickness was set to 2 nm in Step 1, and 1 nm in Step 2, where the desired film thicknesses could be obtained after 20 cycles and 10 cycles, respectively.

TABLE 9

| | | | step | | | | | | | |
|---|---|---|---|---|---|---|---|---|---|---|
| No | Type | Flow gas | Ta pulse | Ta purge | Plasma puls | Purge | Ru pulse | Pu Purge | Plasma puls | Purge |
| 308 | Valve | Ar Flow | OFF | ON | ON | ON | ON | ON | ON | ON |
| 309 | Valve | Ta material | ON | OFF | OFF | OFF | OFF | OFF | OFF | OFF |
| 311 | Valve | Ar Flow | ON | ON | ON | ON | OFF | ON | ON | ON |
| 312 | Valve | Ru material | OFF | OFF | OFF | OFF | ON | OFF | OFF | OFF |
| 314 | Valve | H2 Flow | OFF | OFF | ON | OFF | OFF | OFF | ON | OFF |
| 316 | Valve | N2 Flow | OFF | OFF | ON | OFF | OFF | OFF | ON | OFF |
| 318 | Valve | Ar Flow | OFF | ON | OFF | ON | OFF | ON | OFF | ON |
| 321 | Valve | Ta bottle bypass | OFF | OFF | OFF | OFF | OFF | OFF | OFF | OFF |
| 322 | Valve | Ta bottle IN | ON | ON | ON | ON | ON | ON | ON | ON |
| 323 | Valve | Ta bottle OUT | ON | ON | ON | ON | ON | ON | ON | ON |
| 328 | Valve | Ru bottle bypass | OFF | OFF | OFF | OFF | OFF | OFF | OFF | OFF |
| 329 | Valve | Ru bottle IN | ON | ON | ON | ON | ON | ON | ON | ON |
| 330 | Valve | Ru bottle OUT | ON | ON | ON | ON | ON | ON | ON | ON |
| 320 | MFC | Ar carrier (Ta) | 500 | 0 | 0 | 0 | 0 | 0 | 0 | 0 |
| 327 | MFC | Ar carrier (Ru) | 0 | 0 | 0 | 0 | 500 | 1000 | 0 | 0 |
| 334 | MFC | Ar | 0 | 1000 | 0 | 1000 | 0 | 0 | 0 | 1000 |
| 336 | MFC | N2 Flow | 0 | 0 | 50 | 0 | 0 | 0 | 50 | 0 |
| 338 | MFC | H2 Flow | 0 | 0 | 300 | 0 | 0 | 0 | 300 | 0 |

Once / Y = 1 to 5 times

TABLE 10

| No | Type | Flow gas | step | | | | | | | |
|---|---|---|---|---|---|---|---|---|---|---|
| | | | Ta pulse | Ta purge | Plasma puls | Purge | Ru pulse | Pu Purge | Plasma puls | Purge |
| 308 | Valve | Ar Flow | OFF | ON | ON | ON | ON | ON | ON | ON |
| 309 | Valve | Ta material | ON | OFF | OFF | OFF | OFF | OFF | OFF | OFF |
| 311 | Valve | Ar Flow | ON | ON | ON | ON | OFF | ON | ON | ON |
| 312 | Valve | Ru material | OFF | OFF | OFF | OFF | ON | OFF | OFF | OFF |
| 314 | Valve | H2 Flow | OFF | OFF | ON | OFF | OFF | OFF | ON | OFF |
| 316 | Valve | N2 Flow | OFF | OFF | ON | OFF | OFF | OFF | OFF | OFF |
| 318 | Valve | Ar Flow | OFF | ON | OFF | ON | OFF | ON | OFF | ON |
| 321 | Valve | Ta bottle bypass | OFF | OFF | OFF | OFF | OFF | OFF | OFF | OFF |
| 322 | Valve | Ta bottle IN | ON | ON | ON | ON | ON | ON | ON | ON |
| 323 | Valve | Ta bottle OUT | ON | ON | ON | ON | ON | ON | ON | ON |
| 328 | Valve | Ru bottle bypass | OFF | OFF | OFF | OFF | OFF | OFF | OFF | OFF |
| 329 | Valve | Ru bottle IN | ON | ON | ON | ON | ON | ON | ON | ON |
| 330 | Valve | Ru bottle OUT | ON | ON | ON | ON | ON | ON | ON | ON |
| 320 | MFC | Ar carrier (Ta) | 500 | 0 | 0 | 0 | 0 | 0 | 0 | 0 |
| 327 | MFC | Ar carrier (Ru) | 0 | 0 | 0 | 0 | 500 | 0 | 0 | 0 |
| 334 | MFC | Ar | 0 | 1000 | 0 | 1000 | 0 | 1000 | 0 | 1000 |
| 336 | MFC | N2 Flow | 0 | 0 | 50 | 0 | 0 | 0 | 0 | 0 |
| 338 | MFC | H2 Flow | 0 | 0 | 300 | 0 | 0 | 0 | 300 | 0 |

Once | Y = 1 to 5 times

By applying these processes in the formation of Cu wiring illustrated in FIG. 7, a highly reliable Cu wiring could be formed.

Example 2

A specific example where the process in FIG. 2 is implemented using the apparatus shown in FIG. 4 based on the process sequences shown in FIGS. 5 and 6 is explained.

A Cu wiring is formed according to the process shown in FIG. 8 in a Cu wiring forming process based on dual damascene structure. Silicon substrates having a device that has been processed up to the state in FIG. 8(a) are treated using the apparatus shown in FIG. 10. A silicon substrate is set in a cassette loader 501, and a transfer robot 502 is used to transfer the substrate into a load lock chamber 503, after which the substrate is transferred by a vacuum robot 504 from the load lock chamber 503 into a reaction chamber for plasma atomic layer deposition 505. The next substrate is transferred to a reaction chamber 507, and the subsequent substrate is transferred to a reaction chamber 508, to allow the process to be implemented in a similar manner. The substrate transferred to the reaction chamber 505 is placed on the substrate heating base that has been set to a specified temperature. The reaction chambers 505, 506, 507 have an Ar gas supply 508, a Ru material supply 509 and a Ta gas supply 510, respectively, Furthermore, a hydrogen gas supply 511 and a nitrogen gas supply 515 are also installed. Accordingly, the same process sequence can be implemented in any reactor.

Here, TAIMATA is used as the Ta material, while CpRu(CO)₂Et is used as the Ru material. The process was implemented by adjusting the substrate temperature to a range of 250 to 300 degrees, or preferably to 280 degrees. TAIMATA was heated to 90 degrees, and the Ta material was supplied by means of argon gas, while the Ru material was heated to 35 degrees and supplied by means of argon gas. The supply pressures of Ta and Ru materials were optimized in a range of 150 to 400 Pa, while the process pressures during plasma generation were also optimized in a range of 150 to 400 Pa.

As for the implementation of the process in FIG. 2, Steps 1 and 2 use the sequence shown in FIG. 5, while Step 3 uses the sequence shown in FIG. 6, and based on the structural diagram of the apparatus in FIG. 4 the gas control in the actual process is implemented according to the valve operations and gas flow rates shown in Table 9 for Steps 1 and 2, and those shown in Table 10 for Step 3. Here, the Ru supply cycle is repeated twice in Step 1, once in Step 2, and three times in Step 3, relative to one cycle of Ta material supply, purge, plasma step and purge, in order to control the Ta/Ru composition. The gas flow rates shown in Tables 4 and 5 are representative values, and needless to say these flow rates will change according to the process apparatus, process conditions, etc. A RuTa barrier metal film having the composition shown in FIG. 2 can be formed using the process apparatus shown in FIG. 4 based on the specific process conditions shown in Tables 9 and 10. In this example, the film thickness was set to 1 nm in Step 1, 2 nm in Step 2, and 1 nm in Step 3, where the desired film thicknesses could be obtained after 10 cycles, 20 cycles and 10 cycles, respectively.

Example 3

A specific example where the process in FIG. 1 is implemented using the apparatus shown in FIG. 4 based on the process sequences shown in FIGS. 5 and 6 is explained.

A Cu wiring is formed according to the process shown in FIG. 9 in a Cu wiring forming process based on dual damascene structure. Silicon substrates having a device that has been processed up to the state in FIG. 9(a) are treated using the apparatus shown in FIG. 10. A silicon substrate is set in a cassette loader 501, and a transfer robot 502 is used to transfer the substrate into a load lock chamber 503, after which the substrate is transferred by a vacuum robot 504 from the load lock chamber 503 into a reaction chamber for plasma atomic layer deposition 505. The next substrate is transferred to a reaction chamber 507, and the subsequent substrate is transferred to a reaction chamber 508, to allow the process to be implemented in a similar manner. The substrate transferred to the reaction chamber 505 is placed on the substrate heating base that has been set to a specified temperature. The reaction chambers 505, 506, 507 have an Ar gas supply 508, a Ru material supply 509 and a Ta gas supply 510, respectively, Furthermore, a hydrogen gas supply 511 and a nitrogen gas supply 515 are also installed. Accordingly, the same process sequence can be implemented in any reactor.

Here, TAIMATA is used as the Ta material, while CpRu(CO)$_2$Et is used as the Ru material. The process was implemented by adjusting the substrate temperature to a range of 250 to 300 degrees, or preferably to 280 degrees. TAIMATA was heated to 90 degrees, and the Ta material was supplied by means of argon gas, while the Ru material was heated to 35 degrees and supplied by means of argon gas. The supply pressures of Ta and Ru materials were optimized in a range of 150 to 400 Pa, while the process pressures during plasma generation were also optimized in a range of 150 to 400 Pa.

As for the implementation of the process in FIG. 3, Step 1 uses the sequence shown in FIG. 5, while Step 2 uses the sequence shown in FIG. 6, and based on the structural diagram of the apparatus in FIG. 4 the gas control in the actual process is implemented according to the valve operations and gas flow rates shown in Table 9 for Step 1, and those shown in Table 10 for Step 2. Here, the Ru supply cycle is repeated twice in Step 1 and once in Step 2, and in Step 3 the Ru supply cycle is repeated five times while the Ta supply cycle is repeated once, relative to one cycle of Ta material supply, purge, plasma step and purge. The gas flow rates shown in Tables 4 and 5 are representative values, and needless to say these flow rates will change according to the process apparatus, process conditions, etc. A RuTa barrier metal film having the composition shown in FIG. 3 can be formed using the process apparatus shown in FIG. 4 based on the specific process conditions shown in Tables 9 and 10. In this example, the film thickness was set to 1 nm in Step 1, 2 nm in Step 2, and 2 nm in Step 3, where the desired film thicknesses could be obtained after 10 cycles, 20 cycles and 20 cycles, respectively.

The present invention includes the above mentioned embodiments and other various embodiments including the following:

1) A Cu diffusion barrier metal film characterized in that, in a metal film constituted by Ru and Ta or Ti, the Ru/Ta or Ru/Ti atomic composition ratio changes in the depth direction.

2) A Cu diffusion barrier metal film characterized in that, in a metal film constituted by Ru and Ta or Ti, the N atomic content in the metal film changes in the depth direction.

3) A Cu diffusion barrier metal film characterized in that, in a metal film constituted by Ru and Ta or Ti, the Ru/Ta atomic composition ratio changes in the depth direction and the N atomic content also changes in the depth direction.

4) A Cu diffusion barrier metal film according to 1) above, characterized in that such metal film is formed by i) repeating X1 times a cycle comprising a step to introduce Ta material and a plasma step based on reducing gas, ii) repeating Y1 times a cycle comprising a step to introduce Ru material and a plasma step using a reducing gas, and then iii) repeating i) and ii) Z1 times to form a film having a first Ru/Ta atomic composition, after which the X1/Y1 ratio is changed and the same cycles are repeated Z2 times to achieve a second composition and film thickness, and then the foregoing is repeated at least twice to change the Ru/Ta atomic composition ratio in the depth direction.

5) A Cu diffusion barrier metal film according to 2) above, characterized in that such metal film is formed by i) repeating X1 times a cycle comprising a step to introduce Ta material and a plasma step based on reducing gas, ii) repeating Y1 times a cycle comprising a step to introduce Ru material and a plasma step using a reducing gas, and then iii) repeating i) and ii) Z times to form an alloy of Ru and Ta; wherein hydrogen plasma is used in the plasma step based on reducing gas after the Ru material introduction step to decrease the N content, while the nitrogen gas ratio in the plasma of hydrogen/nitrogen mixed gas is controlled in a manner increasing the N content, in order to control the N content in the aforementioned Cu barrier metal in the depth direction and i) to iii) above are repeated to change the N content in the applicable metal barrier film.

6) A Cu diffusion barrier metal film according to 3) above, characterized in that such metal film is formed by i) repeating X1 times a cycle comprising a step to introduce Ta material and a plasma step based on reducing gas, ii) repeating Y1 times a cycle comprising a step to introduce Ru material and a plasma step using a reducing gas, and then iii) repeating i) and ii) Z1 times to form a film having a first Ru/Ta atomic composition, after which X2 and Y2 are set so that the X2/Y2 ratio becomes different from X1/Y1, and at the same time hydrogen plasma is used in the plasma step based on reducing gas after the Ru material introduction step to decrease the N content, while the nitrogen gas ratio in the plasma of hydrogen/nitrogen mixed gas is controlled to change the manner in which the N content decreases, and i) and ii) are repeated Z2 times to achieve a second thickness associated with a different Ru/Ta atomic composition ratio and N atomic content, and the foregoing is further repeated to change the Ru/Ta atomic composition ratio and N atomic composition ratio in the depth direction.

7) A Cu diffusion barrier metal film according to 4), 5) or 6) above, characterized in that the reducing gas used in the cycle comprising a step to introduce Ta material and a plasma step based on reducing gas is at least nitrogen gas or gas molecules containing nitrogen atoms.

8) A Cu diffusion barrier metal film according to 1) or 3) above, characterized in that the Ru atomic content is low in the bottom layer and high in the top layer, while the Ta atomic content is high in the bottom layer and low in the top layer.

9) A Cu diffusion barrier metal film according to 1) or 3) above, characterized in that the Ru atomic content is high in the bottom layer and low in the intermediate layer, and also higher in the top layer than in the intermediate layer.

10) A Cu diffusion barrier metal film according to 2) or 3) above, characterized in that the N atomic content is high in the bottom layer and low in the top layer.

11) A Cu diffusion barrier metal film according to 2) or 3) above, characterized in that the N atomic content is lower in the top layer than in the intermediate layer and bottom layer.

12) A Cu diffusion barrier metal film according to any one of 1) to 11) above, characterized in that the Ta material is selected from among TAIMATA (Tertiaryamylimidotris(dimethylamido)tantalum), TBTDET (Ta(N-i-C$_4$H$_9$)[N(C$_2$H$_5$)$_2$]$_3$), and PDMAT (Ta[N(CH$_3$)$_2$]$_5$).

13) A Cu diffusion barrier metal film according to any one of 1) to 12) above, characterized in that the Ru material is selected from among materials coordinated by a β-diketone group or groups.

14) A Cu diffusion barrier metal film according to any one of 1) to 12) above, characterized in that the Ru material is selected from among materials coordinated by a carbonyl group or groups.

15) A Cu diffusion barrier metal film according to any one of 1) to 12) above, characterized in that the Ru material is selected from among materials coordinated by one cyclopentadienyl group.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of forming a metal film on a substrate, comprising:
   (i) placing a substrate in a reaction space;
   (ii) conducting atomic layer deposition of Ta or Ti X times, each atomic layer deposition of Ta or Ti being accomplished by introducing a Ta or Ti source gas containing N into the reaction space and applying a reducing gas plasma to the reaction space;
   (iii) after step (ii), conducting atomic layer deposition of Ru Y times, each atomic layer deposition of Ru being accomplished by introducing a Ru source gas into the reaction space and applying a reducing gas plasma in the reaction space;
   (iva) repeating steps (ii) and (iii) Z1 times wherein a ratio of Y/X defined as a first ratio is 1 to 3, and Z1 is 10 to 100, thereby forming a first section of a metal film on the substrate; and then
   (ivb) repeating steps (ii) and (iii) Z2 times using a second ratio of Y/X which is greater than the first ratio wherein Z2 is 10 to 100, thereby forming a second section of the metal film, wherein a proportion of a hydrogen gas plasma in the reducing gas plasma within step (iii) in step (ivb) is higher than that in step (iva), thereby reducing an atomic proportion of N in the second section of the metal film as compared with the first section of the metal film,
   further comprising, between steps (iva) and (ivb), (ivc) repeating steps (ii) and (iii) Z3 times using a third ratio of Y/X which is smaller than the first and second ratios wherein Z3 is 10 to 100, thereby forming an intermediate section of the metal film,
   wherein the reducing gas plasma in step (iii) in steps (iva) and (ivc) is generated from a reducing gas including both nitrogen and hydrogen, and the reducing gas plasma in step (iii) in step (ivb) is generated from H2 gas.

2. The method according to claim 1, wherein the reducing gas plasma in step (ii) is generated from a reducing gas including nitrogen.

3. The method according to claim 1, wherein the reducing gas plasma in step (iii) in step (iva) is generated from a reducing gas including both nitrogen and hydrogen, and as the step of changing the proportion of the hydrogen gas plasma, the reducing gas plasma in step (iii) in step (ivb) is generated solely from $H_2$ gas.

4. The method according to claim 1, wherein the Ta or Ti source gas is an organic Ta source gas selected from the group consisting of TAIMATA (Tertiaryamylimidotris(dimethylamido)tantalum), TBTDET ($Ta(N-i-C_4H_9)[N(C_2H_5)_2]_3$), and PDMAT ($Ta[N(CH_3)_2]_5$).

5. The method according to claim 1, wherein the Ru source gas is a β-diketone-coordinated ruthenium compound.

6. The method according to claim 1, wherein the Ru source gas is a Ru complex having a structure of Xa-Ru—Xb wherein Xa is a non-cyclic pentadienyl and Xb is a cyclopentadienyl.

7. The method according to claim 1, wherein the substrate is a copper wiring substrate having trenches.

8. The method according to claim 1, wherein in step (iva), X is 1 and Y is 1 to 3, and in step (ivb), X is 0 or 1 and Y is 1 to 5 if X=1.

9. The method according to claim 1, wherein in step (iva), X is 1 and Y is 1 to 3; in step (ivc), X is 1 and Y is 0 or 1, and in step (ivb), X is 0 or 1, and Y is 3 to 5 if X=1.

10. The method according to claim 1, wherein
    the atomic composition of Ru, Ta or Ti, and N in the second section is represented as $Ru_{(x1)}Ta/Ti_{(y1)}N_{(z1)}$ wherein an atomic ratio of $Ru_{(x1)}/(Ta/Ti_{(y1)})$ is no less than 15, and z1 is 0.05 or less, and
    the atomic composition of Ru, Ta or Ti, and N in the first section is represented as $Ru_{(x2)}Ta/Ti_{(y2)}N_{(z2)}$ wherein an atomic ratio of $Ru_{(x2)}/(Ta/Ti_{(y2)})$ is more than zero but less than 15, and z2 is 0.10 or greater.

11. The method according to claim 10, wherein $0.75 \leq x1 \leq 1$, $0 \leq y1 \leq 0.05$, $0 \leq z1 \leq 0.05$, $0.02 \leq x2 \leq 0.75$, $0.05 \leq y2 \leq 0.70$, and $0.10 \leq z2 \leq 0.25$.

12. The method according to claim 1, wherein
    the atomic composition of Ru, Ta or Ti, and N in the second section is represented as $Ru_{(x1)}Ta/Ti_{(y1)}N_{(z1)}$ wherein an atomic ratio of $Ru_{(x1)}/(Ta/Ti_{(y1)})$ is no less than 15, and z1 is 0.05 or less,
    the atomic composition of Ru, Ta or Ti, and N in the first section is represented as $Ru_{(x2)}Ta/Ti_{(y2)}N_{(z2)}$ wherein an atomic ratio of $Ru_{(x2)}Ta/Ti_{(y2)})$ is more than zero but less than 15, and z2 is 0.10 or greater, and
    the atomic composition of Ru, Ta or Ti, and N in the intermediate section is represented as $Ru_{(x3)}Ta/Ti_{(y3)}N_{(z3)}$ wherein an atomic ratio of $Ru_{(x3)}Ta/Ti_{(y3)})$ is less than one.

13. The metal film according to claim 12, wherein $0.75 \leq x1 \leq 1$, $0 \leq y1 \leq 0.05$, $0 \leq z1 \leq 0.05$, $0.02 \leq x2 \leq 0.75$, $0.05 \leq y2 \leq 0.70$, $0.10 \leq z2 \leq 0.25$, $0 \leq x3 \leq 0.40$, $0.40 \leq y3 \leq 0.90$, and $0.10 \leq z3 \leq 0.25$.

14. The method according to claim 1, wherein the second section and the first section have a thickness of 1 to 3 nm.

15. The method according to claim 1, wherein the second section, the intermediate section, and the first section have a thickness of 0.5 to 3 nm, 1 to 3 nm, and 0.5 to 3 nm, respectively.

* * * * *

UNITED STATES PATENT AND TRADEMARK OFFICE
CERTIFICATE OF CORRECTION

PATENT NO.         : 8,084,104 B2
APPLICATION NO.    : 12/201434
DATED              : December 27, 2011
INVENTOR(S)        : Shinriki et al.

It is certified that error appears in the above-identified patent and that said Letters Patent is hereby corrected as shown below:

Title page 1 (Item 57) Abstract, at Line 8, Change "Ta/Ti$_{(y1)}$N$_{(z1)}$" to --Ta/Ti$_{(y1)}$N$_{(z1)}$--.

Title page 3 (Item 56) Col. 2, at Line 32, Under Other Publications, change "Toulene" to --Toluene--.

Title page 3 (Item 56) Col. 2, at Line 38, Under Other Publications, change "Packagin" to --Packaging--.

Title page 3 (Item 56) Col. 2, at Line 59, Under Other Publications, change "Relaiability" to --Reliability--.

Title page 4 (Item 56) Col. 2, at Line 59, Under Other Publications, change "hexafluoracetylacetone" to --hexafluoroacetylacetone--.

At column 5, at Approx. Line 35, Below "DESCRIPTION OF THE SYMBOLS", delete "Detailed Description of Embodiments."

At column 6, at Approx. Line 2, Below "-continued", delete "Detailed Description of Embodiments."

At column 6, at Approx. Line 33, Above "The present invention" insert --Detailed Description of Embodiments--.

At column 6, at Line 51, Change "(Ta/Ti$_{(y2)}$<15," to --(Ta/Ti$_{(y2)}$)<15,--.

At column 7, at Approx. Line 10, Change "the the" to --the metal film may have the--.

At column 7, at Approx. Line 12, Change "still" to --still another--.

At column 19, at Approx. Line 54, Change "use" to --used.--.

Signed and Sealed this
Twenty-sixth Day of June, 2012

David J. Kappos
*Director of the United States Patent and Trademark Office*

CERTIFICATE OF CORRECTION (continued)
U.S. Pat. No. 8,084,104 B2

At column 22, at Line 12, Change "Table 1" to --the table--.

At column 22, at Line 15, Change "Table 1" to --the table--.

At column 22, at Line 23, Change "118" to --117--.

At column 22, at Line 35, Change "Table 2" to --the table--.

At column 22, at Line 39, Change "Table 2" to --the table--.

At column 22, at Line 44, Change "Table 2" to --the table--.

At column 22, at Line 64, Change "Table 3" to --the table--.

At column 23, at Line 1, Change "Table 2 in FIG. 2," to --the table in FIG. 3,--.

At column 23, at Approx. Line 6, Change "Table 3" to --the table--.

At column 24, at Approx. Line 9, Change "508," to --506,--.

At column 25, at Line 45, Change "508," to --506,--.

At column 26, at Approx. Line 31, Change "Tables 4 and 5" to --Tables 9 and 10--.

At column 26, at Line 44, Change "FIG. 1" to --FIG. 3--.

At column 26, at Line 64, Change "508," to --506,--.

At column 27, at Line 22, Change "Tables 4 and 5" to --Tables 9 and 10--.

At column 30, at Line 10, In Claim 8, Change "Xis" to --X is--.

At column 30, at Line 14, In Claim 9, Change "Xis" to --X is--.

At column 30, at Line 18, In Claim 10, Change "(Ta/Ti$_{(y1)}$" to --(Ta/Ti$_{(y1)}$)--.

At column 30, at Line 34, In Claim 12, change "Ru$_{(x2)}$Ta/Ti$_{(y2)}$)" to --Ru$_{(x2)}$/(Ta/Ti$_{(y2)}$)--.

At column 30, at Line 38, In Claim 12, Change "Ru$_{(x3)}$Ta/Ti$_{(y3)}$)" to --Ru$_{(x3)}$/(Ta/Ti$_{(y3)}$)--.